US012810777B2

(12) United States Patent
Chaji et al.

(10) Patent No.: US 12,810,777 B2
(45) Date of Patent: Nov. 24, 2026

(54) REPAIR TECHNIQUES FOR MICRO-LED DEVICES AND ARRAYS

(71) Applicant: VueReal Inc., Waterloo (CA)

(72) Inventors: Gholamreza Chaji, Waterloo (CA); Ehsanollah Fathi, Waterloo (CA)

(73) Assignee: VueReal Inc., Waterloo (CA)

( * ) Notice: Subject to any disclaimer, the term of this patent is extended or adjusted under 35 U.S.C. 154(b) by 0 days.

(21) Appl. No.: 19/029,080

(22) Filed: Jan. 17, 2025

(65) Prior Publication Data

US 2025/0167195 A1 May 22, 2025

Related U.S. Application Data

(63) Continuation of application No. 17/601,968, filed as application No. PCT/IB2020/053374 on Apr. 8, 2020.

(60) Provisional application No. 62/831,403, filed on Apr. 9, 2019, provisional application No. 62/831,564, filed on Apr. 9, 2019.

(51) Int. Cl.

*G09G 3/32* (2016.01)
*G09G 3/00* (2006.01)
*H10W 90/00* (2026.01)
*H10H 29/14* (2025.01)

(52) U.S. Cl.

CPC ............... *G09G 3/32* (2013.01); *G09G 3/006* (2013.01); *H10W 90/00* (2026.01); *G09G 2300/0443* (2013.01); *G09G 2300/0452* (2013.01); *G09G 2320/0233* (2013.01); *G09G 2330/08* (2013.01); *G09G 2330/10* (2013.01); *G09G 2360/16* (2013.01); *G09G 2370/00* (2013.01); *H10H 29/142* (2025.01)

(58) Field of Classification Search

CPC .. G09G 3/32; G09G 3/006; G09G 2300/0443; G09G 2300/0452; G09G 2320/0233; G09G 2330/08; G09G 2330/10; G09G 2360/16; G09G 2370/00; G09G 2300/0413; G09G 3/3233; H01L 25/50; H01L 25/18; H01L 25/0753; H01L 21/67288; H10H 29/142; H10H 20/01

See application file for complete search history.

(56) References Cited

U.S. PATENT DOCUMENTS 11,302,244 B2 4/2022 Chaji
2006/0244476 A1 11/2006 Zhang et al.
2007/0109327 A1* 5/2007 Cok .................... G09G 3/2003 345/690

(Continued)

FOREIGN PATENT DOCUMENTS

EP 1424673 A1 11/2002
KR 20150142562 A 12/2015
WO 2004088621 A1 10/2004

OTHER PUBLICATIONS

WIPO: International Search Report and Written Opinion relating to PCT application No. PCT/IB2020/053374 Jul. 2, 2020.

(Continued)

*Primary Examiner* — Premal R Patel

(57) ABSTRACT

What is disclosed are structures and methods for repairing emissive display systems. Various repairing techniques embodiments in accordance with the structures and methods are provided to conquer and mitigate the defected pixels and to increase the yield and reduce the cost of emissive displays systems.

20 Claims, 27 Drawing Sheets

(56) References Cited

U.S. PATENT DOCUMENTS

| | | | |
|---|---|---|---|
| 2007/0273626 | A1 | 11/2007 | Kerofsky et al. |
| 2014/0367633 | A1 | 12/2014 | Bibl et al. |
| 2015/0348466 | A1 | 12/2015 | Park et al. |
| 2016/0217720 | A1 | 7/2016 | Chaji |
| 2017/0004763 | A1 | 1/2017 | Mosier |
| 2017/0025075 | A1 | 1/2017 | Cok |
| 2017/0263811 | A1 | 9/2017 | Zou et al. |
| 2018/0095124 | A1 | 4/2018 | Chaji et al. |
| 2018/0114878 | A1 | 4/2018 | Danesh |
| 2018/0374738 | A1 | 12/2018 | Lee |
| 2019/0080666 | A1 | 3/2019 | Chappalli |
| 2019/0080970 | A1 | 3/2019 | Chaji |
| 2019/0189049 | A1* | 6/2019 | An ........................ G09G 3/2003 |
| 2019/0237449 | A1 | 8/2019 | Shin |
| 2019/0385513 | A1 | 12/2019 | Iguchi |
| 2020/0051482 | A1 | 2/2020 | Cok |
| 2020/0212269 | A1* | 7/2020 | Akimoto ............... H10F 39/182 |
| 2021/0384267 | A1 | 12/2021 | Yu et al. |

OTHER PUBLICATIONS

USPTO; OA related to U.S. Appl. No. 19/028,913 dated Apr. 22, 2026.
USPTO; OA related to U.S. Appl. No. 18/826,849 dated Sep. 4, 2026.

* cited by examiner

REPAIR TECHNIQUES FOR MICRO-LED DEVICES AND ARRAYS

CROSS-REFERENCE TO RELATED APPLICATIONS

This application is a continuation of U.S. application Ser. No. 17/601,968 filed Oct. 7, 2021 which is a 371 of PCT/IB2020/053374 file Apr. 8, 2020 which claims priority to and benefit of U.S. Provisional Patent Application No. 62/831,403, filed Apr. 9, 2019 and U.S. Provisional Patent Application No. 62/831,564, filed Apr. 9, 2019. Each of the prior applications are incorporated by reference herein in their entirety.

BACKGROUND AND FIELD OF THE INVENTION

The present disclosure relates generally to micro LED displays and, more particularly, provides repairing techniques for micro LED displays. Further, disclosure also relates to optoelectronic solid state array devices and more particularly relates to methods and structures to improve light output profile of the solid state array devices.

SUMMARY

Test and repair of micro LED displays including micro devices transferred to the system substrate is very crucial to increase the yield. While using spare micro devices can increase the yield, it can increase the costs as well. The embodiments described below are directed toward enabling easy and/or practical repair processes to increase the yield and reduce the cost.

In accordance with one embodiment, a display system on a system substrate may be provided. The display system may comprising an array of pixels, wherein each pixel comprising a group of subpixels arranged in a matrix; the group of sub-pixels comprising at least one defective sub-pixel; and a defect mapping block to map data from the at least one defective sub-pixel to at least one surrounding spare sub-pixel.

In accordance with another embodiment, a method of repairing a pixel circuit comprising a plurality of pixels may comprise providing a group of more than two sub-pixels and a spare sub-pixel for each pixel, detecting at least one defective sub-pixel in the group of the sub-pixels, and converting the spare sub-pixel with a color conversion or color filter to create a color same as that of the defected sub-pixel.

In a further embodiment, a method of repairing a pixel circuit may be provided. The method may comprise providing a pixel comprises more than one primary sub-pixels with high wavelength emission, applying a color conversion material to at least one of the primary sub-pixels to convert the high wavelength emission into a different emission wavelength from the high wavelength emission, identifying a defective sub-pixel in the primary sub-pixels; and mapping a spare sub-pixel to a same primary color as of the defective primary sub-pixel by using the color conversion material.

In accordance with yet another embodiment, a method of repairing a pixel circuit may be provided. The method may comprise providing a pixel comprises more than one primary sub-pixels with combined wavelength emission, applying a color filter material to at least one of the primary sub-pixels to convert the combined-wavelength emission into a different emission wavelength; identifying a defective sub-pixel in the primary sub-pixels; and mapping the spare sub-pixel to the same primary color as of the defective primary sub-pixel by using the color filter material.

In accordance with some embodiment, a method of repairing a pixel circuit may be provided. The method may comprise providing a pixel comprises at least one high-wavelength primary sub-pixels, providing at least one spare sub-pixel with a same wavelength, identifying a defective sub-pixel in the primary and the spare sub-pixels; and mapping a color conversion layer to the sub-pixels without the defect so that there is at least on sub-pixel for each intended primary sub-pixels.

In accordance with another embodiment, a method of repairing a pixel circuit may be provided. The method may comprise providing a pixel comprises at least one combined-color sub-pixels, providing at least one spare sub-pixel with the same combined-color, identifying a defective sub-pixel in the primary and the spare sub-pixels; and mapping a color filter layer to the sub-pixels without the defect so that there is at least one sub-pixel for each intended primary sub-pixels.

In accordance with yet another embodiment, a method to replace defective sub-pixels with spare sub-pixels in a display system may comprising providing a periodic spatial variation to a position of sub-pixels in the display, calculating a maximum and a minimum distance between the spare sub-pixels and the defected sub-pixels, extracting a variation in coordinates of sub-pixels; and replacing the defective micro-devices with the spare sub-pixels based on the calculated variation.

In accordance with yet another embodiment, a method of correcting spatial non-uniformity of an array of optoelectronic devices wherein a part of the signals created or absorbed by the optoelectronic devices is blocked based on the spatial non-uniformity in said array.

The present invention also relates to methods and structures to improve light output profile of the solid state array devices.

According to one embodiment, a method of manufacturing a pixelated structure may be provided. The method may comprise providing a donor substrate comprising the plurality of pixelated micro devices, bonding a selective set of the pixelated micro devices from the donor substrate to a system substrate; and patterning a bottom conductive layer of the pixelated micro devices after separating the donor substrate from the system substrate.

According to one embodiment, there may be provided a donor substrate with plurality of micro devices with bonding pads and filler layers filling the space between the micro devices.

According to another embodiment, the donor substrate may be removed from the lateral functional devices.

According to one embodiment, one or more of the bottom layers after the separation of the donor substrate (or the donor substrate) may be patterned.

According to some embodiments, the patterning may be done by fully isolating the layers or leaving some thin layers between the patterns.

According to other embodiments, a specific ohmic contact may be needed to get proper connection to the patterned bottom conductive layer.

According to one embodiment, the ohmic contact may be one of an opaque or transparent material.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and additional aspects and embodiments of the present disclosure will be apparent to those of ordinary skill in the art in view of the detailed description of various embodiments and/or aspects, which is made with reference to the drawings, a brief description of which is provided next.

FIG. 1*a* illustrates an example of a pixel array including no defective sub-pixel.

FIG. 1*b* illustrates an example of a pixel array including transferring of a defective sub-pixel contribution to a spare subpixel.

FIG. 2*a* shows an example of a pixel array having one spare sub-pixel for each pixel.

FIG. 2*b* shows an example of a pixel array including transferring of a defective sub-pixel contribution to a spare neighboring subpixel.

FIG. 5*a*-5*c* demonstrates a surround mapping technique to repair defective micro devices.

FIG. 7*c* shows a 1-dimensional distribution of spare elements distributed across the same or neighbor row in which the defect is detected.

FIG. 21B-2 shows a cross-sectional view of the integrated structure where the ohmic contact is at the edge of the isolated patterns of the patterned bottom electrode, in accordance with an embodiment of the present invention.

Figure 1:
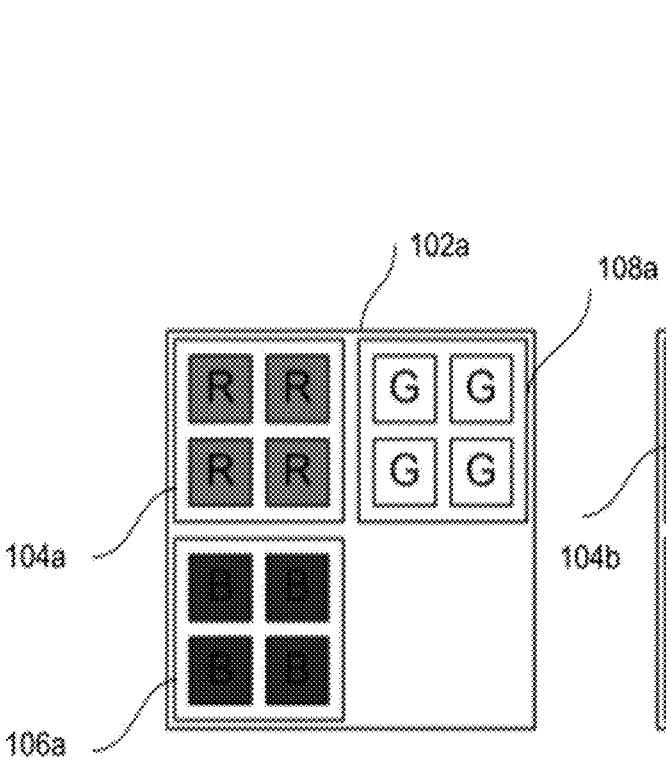
FIG. 21B-1 shows a cross-sectional view of the integrated structure where the ohmic contact is inside the isolated patterns of the patterned bottom electrode, in accordance with an embodiment of the present invention.
Figure 1:
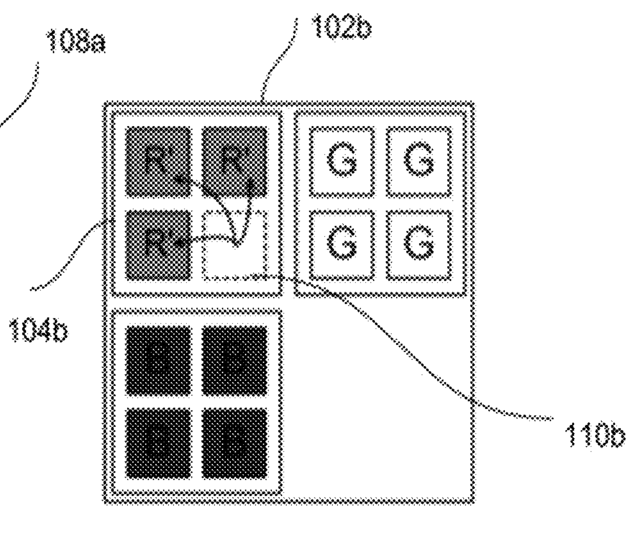

While the present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of an invention as defined by the appended claims.

DETAILED DESCRIPTION

The micro-LED displays may suffer from several sources of defects including device (micro-LED) open/short issues, device transfer/integration/bonding defects, and substrate driver pixel defects. Repair of micro-LED displays including defective micro devices transferred to the system substrate is very crucial to increase the yield. While using spare micro devices can increase the yield, it can increase the costs as well. The embodiments below are directed toward enabling repairing techniques to increase the yield and reduce the cost of emissive displays.

Unless defined otherwise, all technical and scientific terms used herein have the same meaning as commonly understood by one of ordinary skill in the art to which this invention belongs.

As used in the specification and claims, the singular forms "a", "an" and "the" include plural references unless the context clearly dictates otherwise.

In this description, the term "device" and "micro device" are used interchangeably. However, it is clear to one skilled in the art that the embodiments described here are independent of the device size.

In this description, the term "donor substrate" and "micro device substrate" are used interchangeably.

In this description, the term "receiver substrate", "system substrate" and "backplane" are used interchangeably.

Examples of optoelectronic devices are sensors and light emitting devices, such as, for example, light emitting diodes (LEDs).

The term "comprising" as used herein will be understood to mean that the list following is non-exhaustive and may or may not include any other additional suitable items, for example one or more further feature(s), component(s) and/or element(s) as appropriate.

Defect Repair Techniques

In micro device system integration, the devices are fabricated in their native ambient conditions, then they are transferred to a larger system substrate. In one case, the micro device is functional after being placed on the system substrate since it has functional connections to the system substrate. In another case, post processing is needed to make the device functional. common processing step includes creating connections between the micro device and the system substrate, in which case, the system substrate may be planarized first and a thick (1-2 micrometer) dielectric layer is deposited on top of system substrate. If needed, the contact areas to the micro devices are opened by patterning and etching the planarization layer. Thereafter, the electrode is deposited and patterned if needed.

In this description, the term "device" and "micro device" are used interchangeably.

However, it is clear to one skill in the art that the embodiments described here are independent of the device size.

In this description, the term "spare device" and "redundant device" are used interchangeably. However, it is clear to one skill in the art that the "spare device" and "redundant device" analogous in meaning to a device that not strictly necessary to functioning but included in case of failure in another device.

The main challenge with such integration is to identify the defective transferred devices and repair them or the emissive display if needed. After the tests, the defective pixels are identified. The defective pixels either can be fixed or disabled. One way to repair a defect after identification is to remove the defective device from the pixel and replace it with a new one. The main drawback of doing this is the risk that the pixel might be damaged during removal of the defective device. Various repairing techniques embodiments in accordance with the structures and processes provided are described below in detail to conquer and mitigate the defected pixels.

Included are redundancy schemes comprising multiple redundancy, distributed redundancy, and defect mapping techniques. Other embodiments include repair by color conversion comprising fixed sub-pixels with redundant blue structure and all blue structure.

Here, the embodiments are described in the context of pixelated systems (e.g., display, sensors, and other array structure), however, similar approaches can be used for other system configurations. Moreover, although the embodiments illustrate techniques applied to micro devices, it is to be understood that they can be applied to any other device size.

In one approach illustrated in FIG. 1*a*, a pixel circuit 102*a* may comprising a plurality of pixels integrated on a system substrate (not shown in FIG. 1*a*) of a display system. Each pixel such as 104*a*, 106*a* and 108*a* may comprising a group of subpixels including a subpixel and a group of spare sub-pixels of same primary color. Each array of subpixels configured to emit separate primary color. E.g. a first group of subpixels 104*a* may emit red primary color, a second group of subpixels 106*a* may emit blue color and a third group of subpixels 108*a* may emit green color. Each subpixel may be a micro-LED.

In such system, when a subpixel e.g. subpixel is detected to be defective after the integration process, the luminance contribution of the defected subpixel 110*b* may be transferred to the spare ones 104*b* as shown in FIG. 1*b*. Each spare sub-pixel of each pixel may be configured to emit a same primary color as of the defective sub-pixel.

In another embodiment as illustrated in FIGS. 2*a* and 2*b*, where it is desired to limit the quantity of integrated micro-devices, a sparse redundancy such as the pattern illustrated in FIG. 2*a* may be utilized. In the system of FIG. 2*a*, a cluster of pixels (4 full pixels) may integrated on the substrate (not shown in FIG. 2*a*), wherein each cluster 202*a* may comprising a set of pixels and a set of spare subpixels and each pixel comprising a set of subpixels (R, G, B) and a spare subpixel e.g. 204*a* and 206*a*. In such system, when a subpixel 202*b* is detected to be defective after the integration process, the luminance contribution of the defected subpixel may be transferred to the spare neighbor 204*b* as shown in FIG. 2*b*.

In above approaches and embodiments, as the configuration has four micro-LED for each subpixels, and one of the micro-LED is not functional, the each one of the remaining micro-LED brightness will increase by ⅓ to compensate for the brightness loss caused by the defective micro-LED. The main issue with these approaches is that the number of micro-LEDs per display increases dramatically. As a result, the cost of the material increases as well. Thus, for some defect repair mechanisms where a display controller needs to redirect the data flow to the redundant circuits, defect mapping techniques are used. These techniques rely on using two or more redundant elements to artificially shift the effective coordinates of the repaired element within the constructed image.

Figure 3:
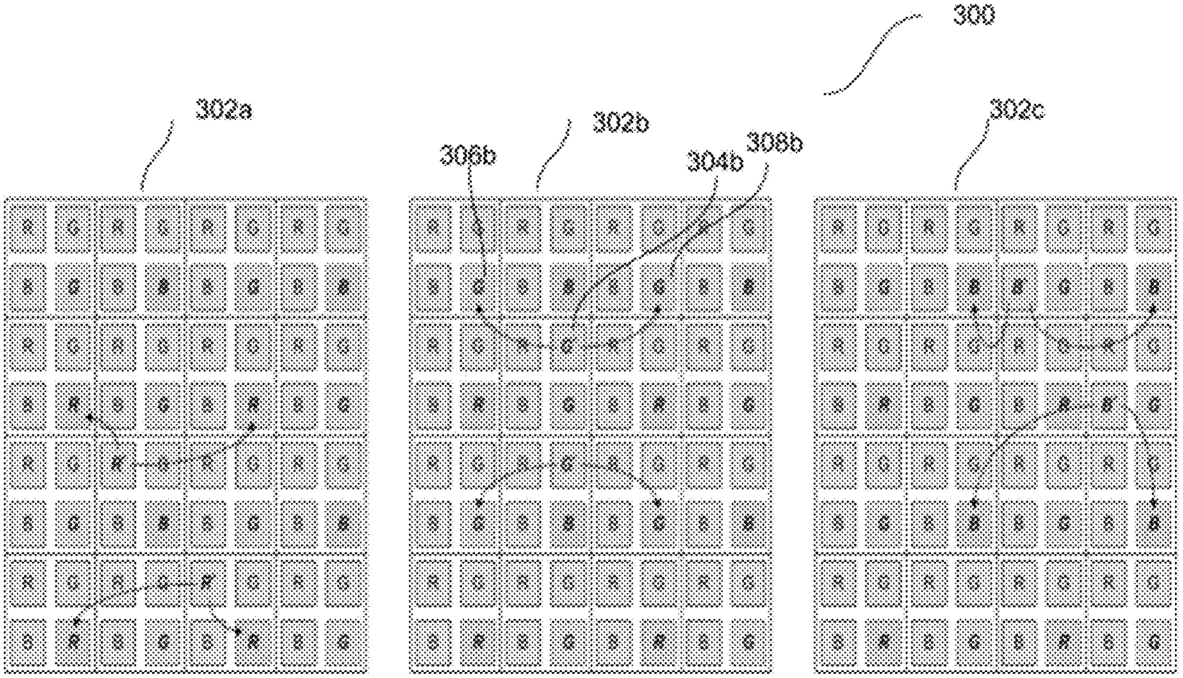
FIG. 3*a*-3*c* demonstrates a predefined mapping technique to repair defective micro devices.

FIG. 3*a*-3*c* demonstrates a predefined mapping technique to repair defective micro devices. In one embodiment, a display system with an array of pixels and having at least one defected pixel in the array of pixels may utilize a predefined group of redundant elements. In this case, each defected micro-device is mapped to the one or more than one spare micro-devices in vicinity of the defected device. The functionality (e.g. the brightness) is shared between the mapped spare devices with predefined values. Thus, a brightness value of the defective sub-pixel is shared between surrounding spare sub-pixels based on predefined values. For example, as shown in 302*b*, a green defected subpixel 304*b* can be mapped to two adjacent space green micro-LED 306*b* and 308*b*. Each one of the spare ones 306*b* and 308*b* can produce 50% of the brightness for the defected green subpixel 304*b*. An example of this is shown in FIG. 3*b*. Similar approaches may be employed for red and blue defective sub-pixels as shown in 302*a* and 302*c*.

Figure 4:
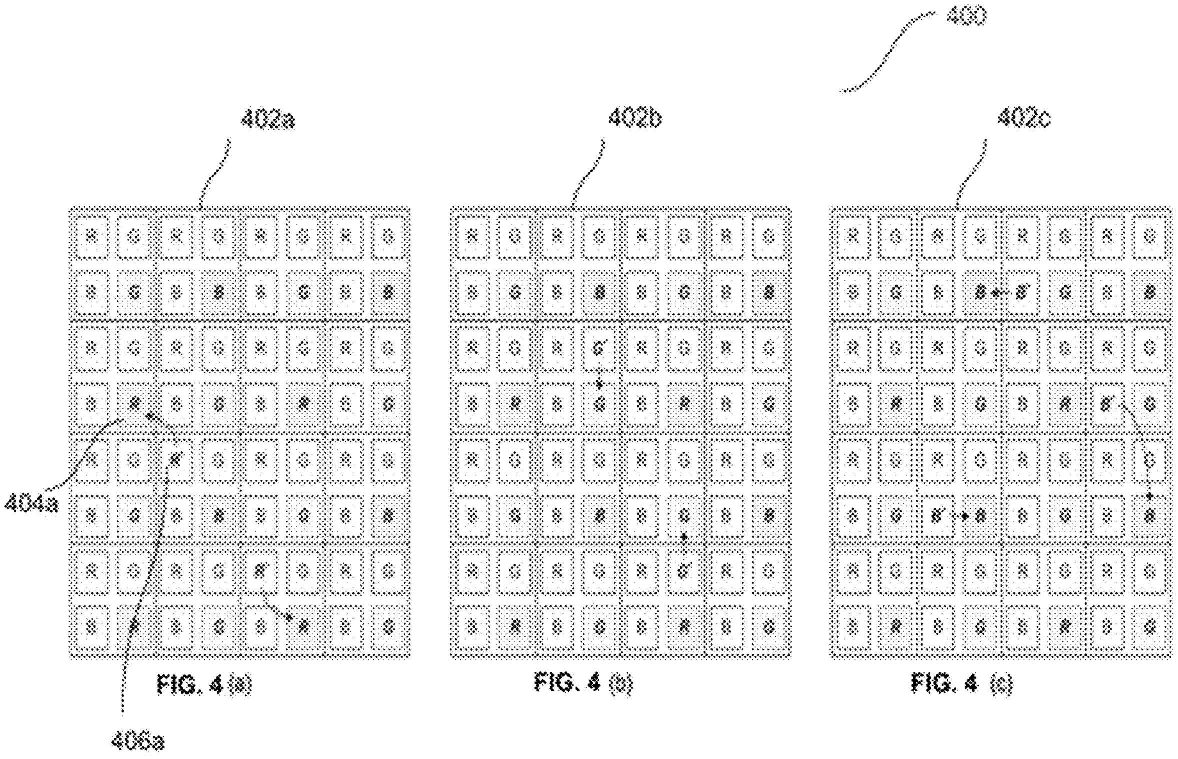
FIG. 4*a*-4*c* demonstrates a proximity mapping technique to repair defective micro devices.

In other embodiment, the brightness share of the spare devices is calculated based on a geometric distance between the defected pixel and the surrounding spare devices. Either a lookup table or a formula can be used to extract the brightness share of the surrounding spare devices. In one example, as shown in FIGS.' 4*a*-4*c*, the spare device with shortest geometric distance from the defected subpixel creates 100% of the brightness. As illustrated in FIG. 4*a*, a display system 402*a* with an array of pixels and having at least one defected pixel 406*a* in the array of pixels may utilize the spare device 404*a* based on the shortest geometric distance between the defected pixel and the spare devices. Similar approaches may be employed for green and blue defective subpixels as shown in display systems 402*b* and 402*c* of FIGS.' 4*b* and 4*c*, respectively.

Figures 5, 5A, 5C:
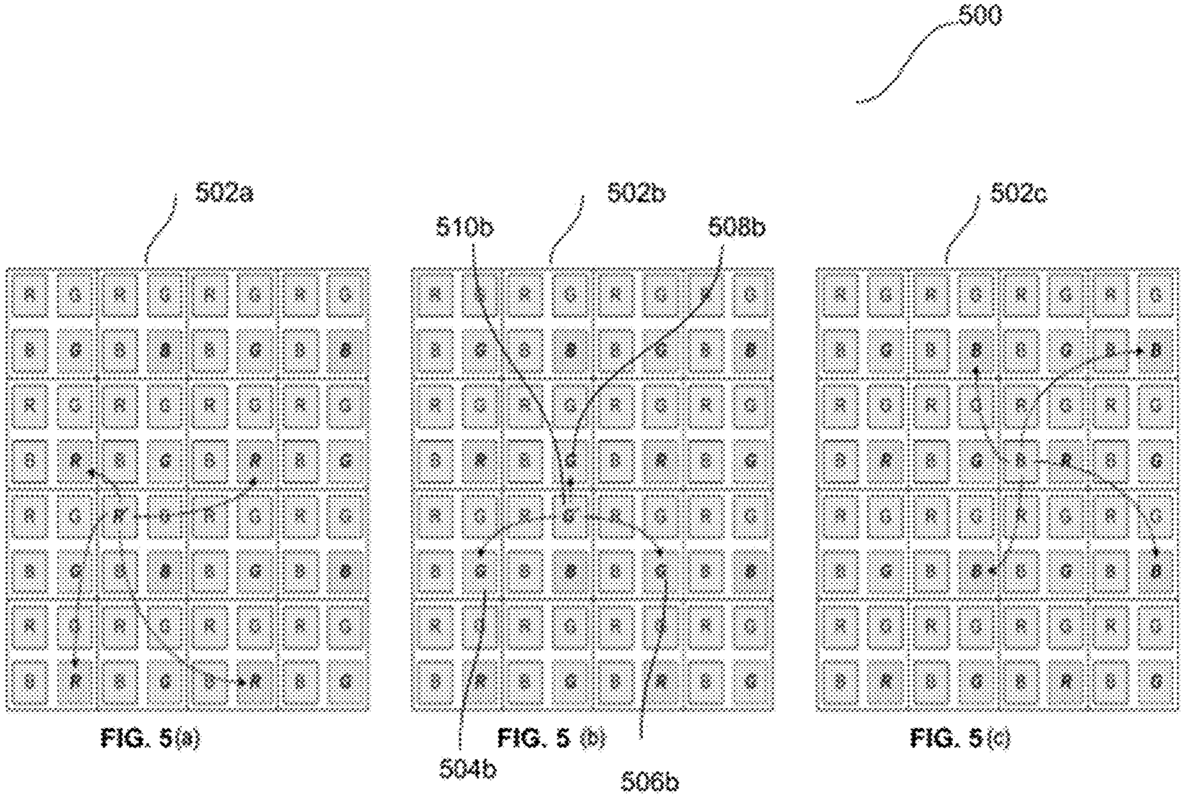

In another example, surround mapping techniques may be employed to repair defective micro devices as demonstrated in FIGS.' 5*a*-5*c*. In one embodiment, a display system 502*a* comprising a plurality of subpixels and at least one defected pixel may utilize adjacent or surrounding spare devices equally. The brightness (or signal) of the defective devices is replaced by the adjacent devices equally. If there are three spare devices surrounding the defective device, the % of the brightness (or signal) is created by each spare device. In one example, as shown in FIG. 5*b*, three spare devices (504*b*, 506*b* and 508*b*) surrounding the defective green device 510*b*, the ⅓ of the brightness (or signal) is created by each spare device. The brightness (or signal) of the defective green device 510*b* is replaced by the adjacent spare green devices (504*b*, 506*b* and 508*b*) equally. Similar approaches may be employed for green and blue defective subpixels as shown in display systems 502*a* and 502*c* of FIGS.' 5*a* and 5*c*, respectively.

Figure 6:
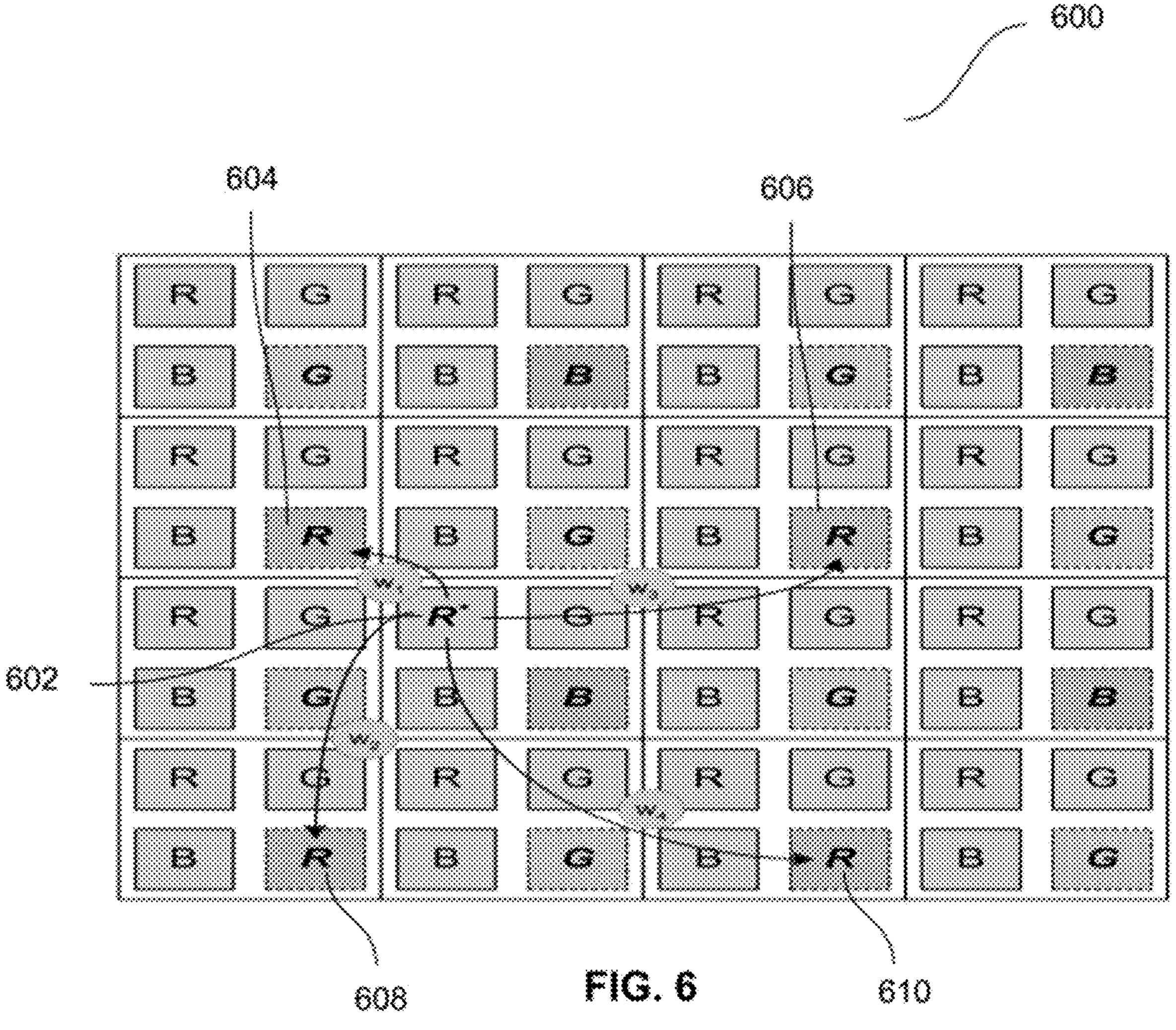
FIG. 6 demonstrates a weighted mapping technique to repair defective micro devices.

FIG. 6 demonstrates a weighted mapping technique to repair defective micro devices. In one embodiment, a display system 600 comprising a plurality of spare subpixels and at least one defected pixel 602 may utilize exact ratio of the geometric distance from the defected subpixel. The brightness share of each spare subpixel (604, 606, 608 and 610) is calculated based on the exact ratio of the geometric distance from the defected subpixel 602.

In another embodiment, any combination of these above embodiments may also feasible. The brightness in the above embodiments can be any other signal output from different micro devices.

Figures 7, 7A, 7B:
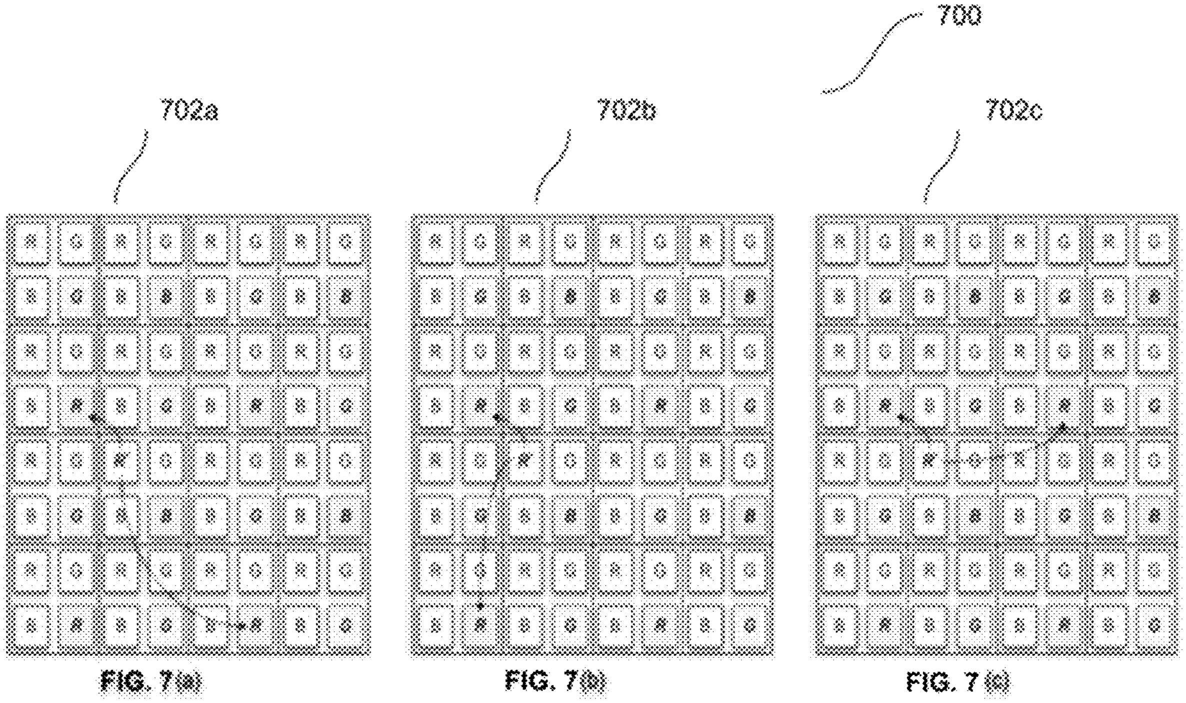
FIG. 7*a* shows a 2-dimensional distribution of spare elements distributed across rows and columns of the pixel array.
FIG. 7*b* shows a 1-dimensional distribution of spare elements distributed across rows and columns of the pixel array.

There are many other approaches which can be utilized to repair the defective micro device. In one approach, in a display system 702*a* with an array of pixels, a 2-dimensional distribution of redundant elements distributed across rows and columns of the pixel array may be utilized as demonstrated in FIG. 7*a*. In another approach, in a display system 702*b* with an array of pixels, 1-dimensional distribution of redundant elements distributed across rows and columns of the pixel array may be utilized as shown in FIG. 7*b*. In yet another approach, in a display system 702*c* with an array of pixels, 1-dimensional distribution of redundant elements distributed across the same or neighbor row in which the defect is detected may be utilized as shown in FIG. 7*c*.

In yet another case, a display system with an array of pixels may utilizing above cases along with a buffer memory having a size corresponding to the number of rows occupied by the distributed redundancy in order to store and reuse the video/image data.

In another case, a display system with an array of pixels may utilizing above cases above along with a buffer memory having a size corresponding to a single row (where the defective pixel(s) are detected) in order to store and reuse the video/image data.

Defect mapping may be implemented in different levels/layers of a display system. In one embodiment, where a display system containing one or more defected pixel/sub-pixel, is repaired by physical mapping (e.g. post-fab laser repair) of the defected pixel/subpixel to a single or a group of spare/redundant repair elements.

In one embodiment, where a display system containing one or more defected pixel/sub-pixel, is repaired by driver mapping (i.e. programmable flash memory, OTP memory, or fuse in the driver component) of the defected pixel/subpixel to a single or a group of spare/redundant repair elements.

In yet other embodiment, where a display system containing one or defected pixel/sub-pixel, is repaired by soft mapping (i.e. mapping by the timing controller (TCON)) of the defected pixel/subpixel to a single or a group of spare/redundant repair elements. In another embodiment, where a display system containing one or more defected pixel/sub-pixel, is repaired by any combination of above embodiments.

Repair by Color-Conversion

In most cases, defected pixels may not be detected until after deposition of the display system common electrode. Accordingly, physical repair of defected elements may become challenging. Different embodiments illustrating several design approaches and manufacturing techniques may disclosed here to facilitate the repair process.

Fixed Sub-Pixels with Redundant Blue Structure

Figure 8A:
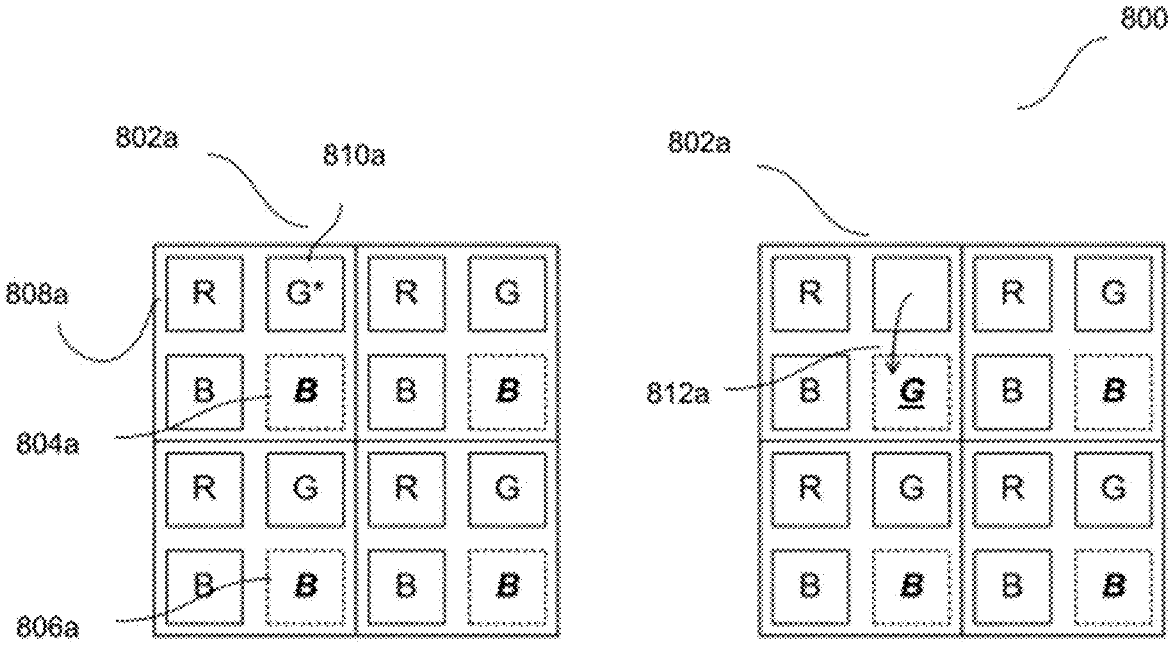
FIG. 8Aa shows an example of pixel array with fixed RGB and a spare blue sub-pixel, wherein a defective green sub-pixel detected in the post-production inspection, FIG. 8Ab shows an example of pixel array with fixed RGB and a spare blue sub-pixel, wherein the spare blue sub-pixel converted to green.

FIG. 8*a* shows a pixel array with fixed RGB and a redundant blue subpixel. In this embodiment 802*a*, every pixel may contain a fixed combination of sub-pixel elements (RBG, RGBW, or other combinations in stripe, diamond, or other patterns). Each pixel may further include an extra Blue or a combined-color (e.g. white, orange, yellow, purple) subpixels (804*a*, 806*a*) which may be utilized for the repair purpose.

Once the integration, passivation, and common-electrode deposition steps are completed, the display panel may be inspected to detect and record the coordinates of defected pixels. The post-processing equipment in the manufacturing line may then cover (printing, patterning, or stamp) the redundant-blue subpixel with color-conversion material (Q-dot or Phosphor) to replace the defective subpixel or in case of combined-color device, color filter can be used to extract the color needed for the defective subpixel.

A 2×2 array 802*a* of such system using RGB subpixel components along with a spare blue sub-pixel is illustrated in FIG. 8Aa and FIG. 8Ab. Once a subpixel is detected to be defective in the array, then the spare blue colour may converted to same primary color as of the defective subpixel by use of color conversion material (FIG. 8A(b)). For example, a fixed RGB and a spare blue sub-pixel (804*a*, 804*b*) may be provided in a pixel 808*a*. During, the post-production inspection, if a defective green sub-pixel 810*a* is detected, the spare blue sub-pixel may be converted to green 812*a* using the color-conversion material.

Figure 8B:
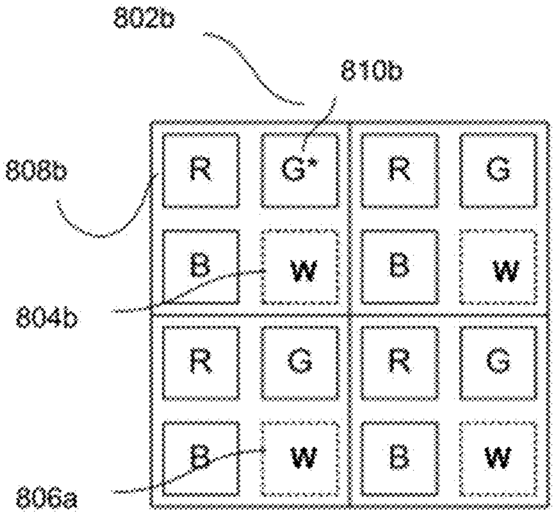
FIG. 8Ba shows an example of pixel array with fixed RGB and a spare combined color sub-pixel, wherein a defective green sub-pixel detected in the post-production inspection, FIG. 8Bb shows an example of a pixel array wherein the spare combined color sub-pixel converted to green.
Figure 8B:
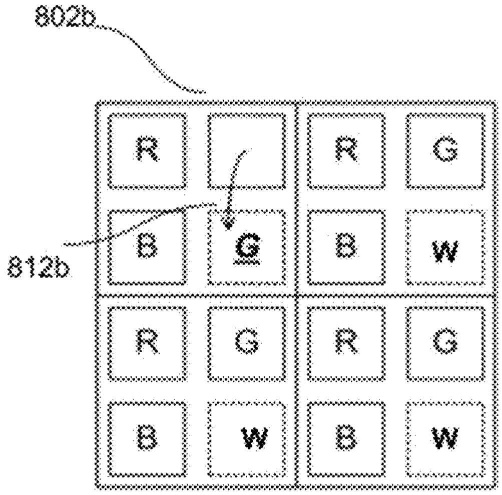

FIG. 8Ba and FIG. 8Bb shows a pixel array 802*b* where redundant white subpixel converted to green. In case of the combined-color case shown in FIGS. 8B, the spare device will be covered by a color filter to create the primary color (FIGS. 8Ba and 8Bb) as of the defective sub-pixel. For example, a fixed RGB and a spare white sub-pixel (804*b*, 806*b*) may be provided in a pixel 808*b*. During, the post-production inspection, if a defective green sub-pixel 810*b* is detected, the spare blue sub-pixel may be converted to green 812*b* using the color-conversion material. The blue or white are used as an example and can be replaced with other high energy photons or combined color.

All Blue or Combined-Color Structure

Figure 9:
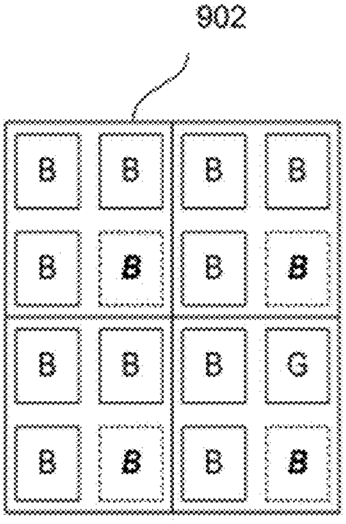
FIG. 9*a*-9*c* shows an architecture of pixel array populated by blue micro-devices.
Figure 9:
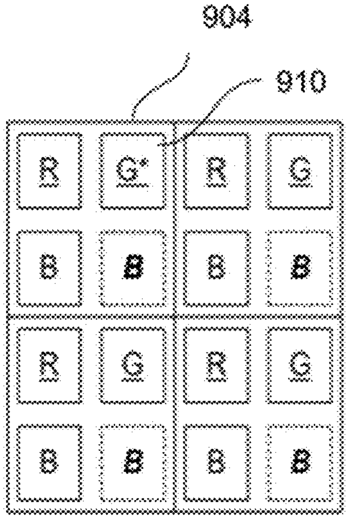
Figure 9C:
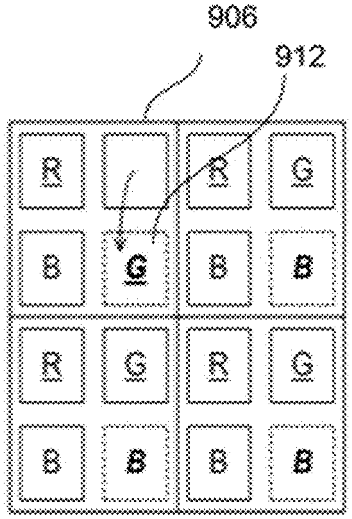

FIG. 9*a*-9*c* shows an architecture of pixel array populated by blue micro-devices. As shown in FIG. 9*a*, the entire array 902 may populated by one type of high-wavelength primary micro-device only (e.g. a blue or a combined color). The display system illustrated in FIG. 9(*a*) features an all-blue micro-LED array. Subsequently, the populated array may go through multiple post-integration processes, e.g. passivation, planarization, and common electrode deposition. An inspection system may then determine the coordinates of the defected pixels. As shown in FIG. 9(*b*)-(*c*), the display panel may then go through a production step where functional sub-pixels may be covered (printing, patterning, or stamp) by color-conversion (quantum dots, or Phosphor) or color-filter material to form the desired colored-pixel pattern (RGB, RGBW, RGBY, . . . ) using a fixed or spatially optimized mapping. In the same step of production, all defected pixels will be remapped by color converting the redundant blue sub-pixel. For example, as shown in FIG. 9*a*, an array 902 may be populated by all blue color sub-pixels. During, the post-production inspection, a defective green sub-pixel 910 is detected, the spare blue sub-pixel may be converted to green 912 using the color-conversion material. In one embodiment, in case of combined-color device, color filter can be used to extract the color needed for the defective subpixel.

Spatial Coordinate Variation

In most of the repair process by redundancy or spare micro-devices, there is spatial coordinate difference between the actual defected device and the spare or redundant device. This can be perceived as visual artifacts. To address this issue, one embodiment of the invention adds predefined (or periodic) spatial coordinate variation to the devices. The variation can be either in one direction or both. Here, the maximum and minimum distance between the spare device and the possible represented defected device is extracted. Then, the variation in the coordinates is extracted to minimize the effect of the spare device location.

Figure 10A:
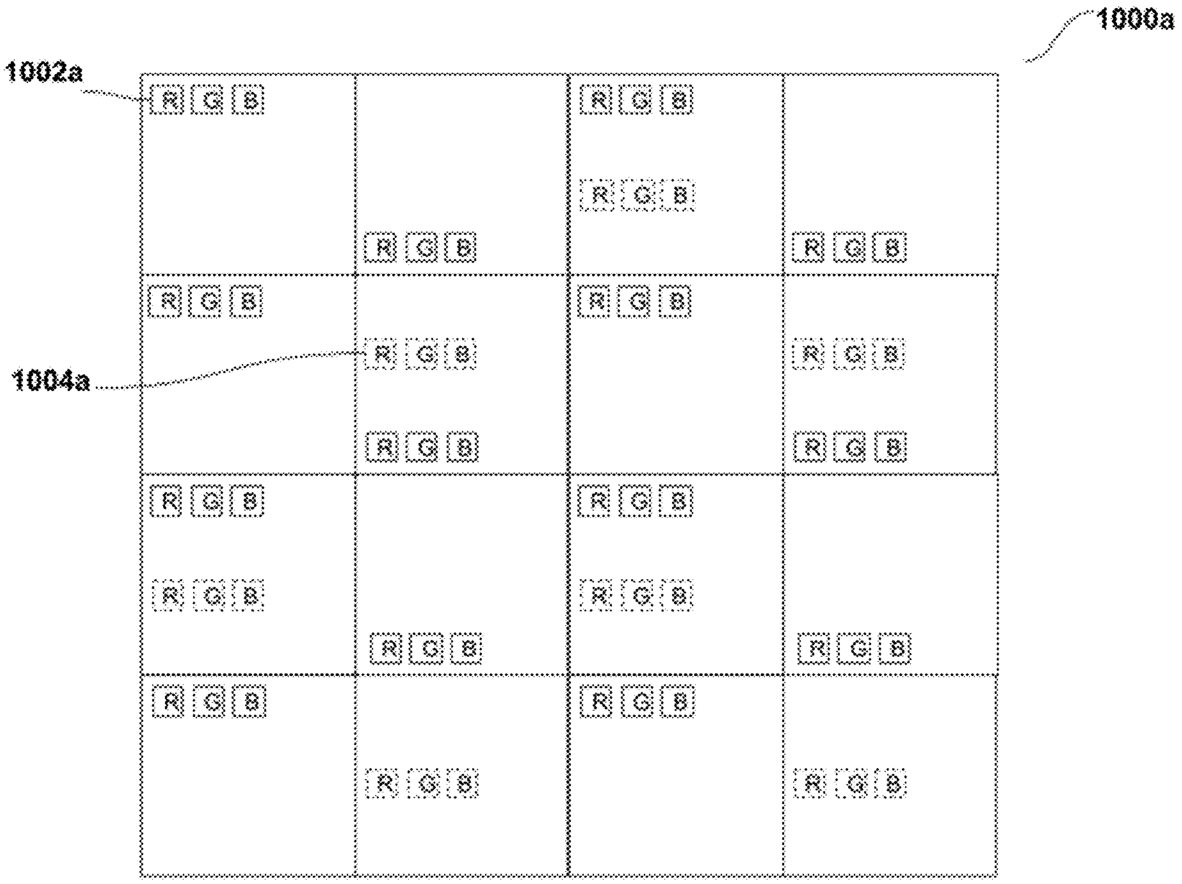
FIG. 10*a* shows a periodic spatial variation to the position of micro-devices in a display system.
Figure 10B:
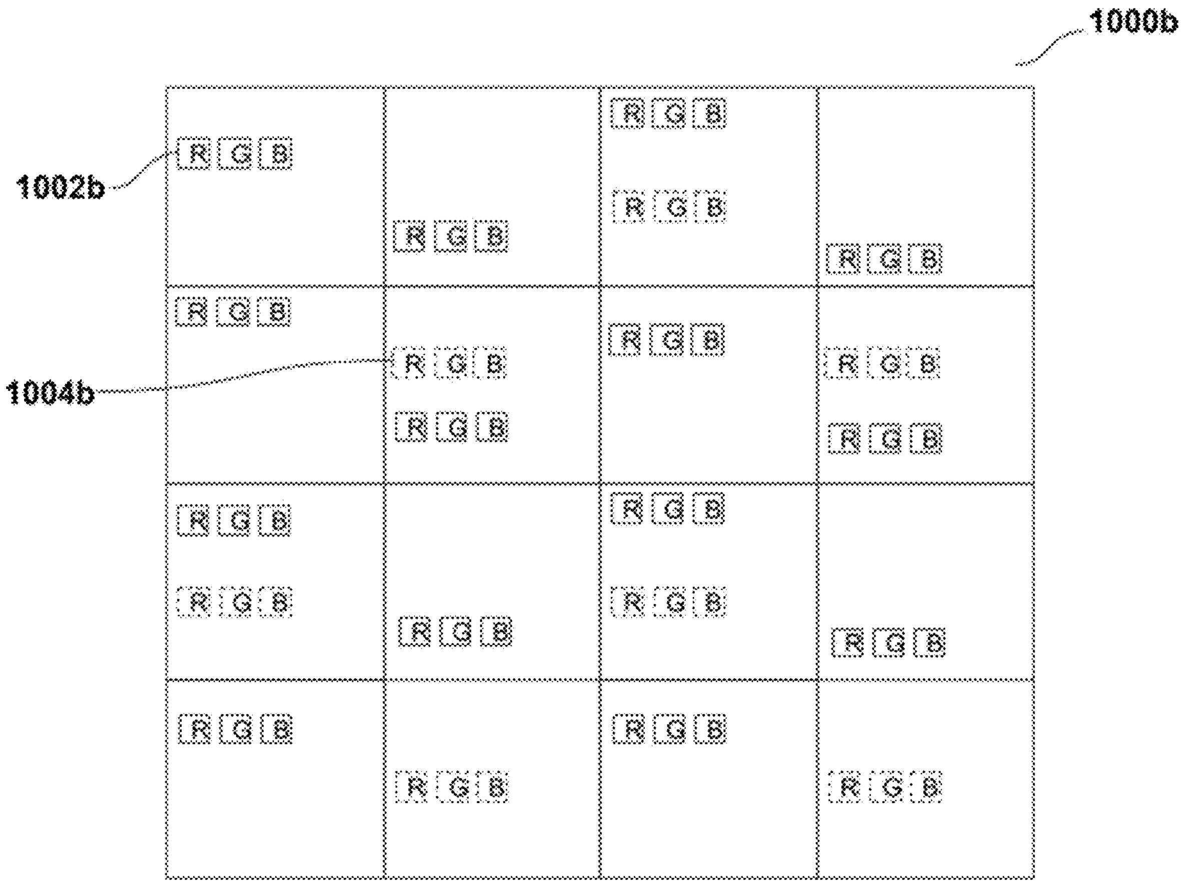
FIG. 10*b* shows a random spatial variation to the position of micro-devices in a display system.

FIG. 10*a* shows a periodic spatial variation to the position micro-devices 1002 in a display system 1000*a* using RGB. FIG. 10*b* shows another example, where random spatial variation is added to the micro-devices 1002*b* (e.g. R, G, B) in a display system 1000*b*. The same methods described in FIGS. 10*a* and 10*b* can be used to a display with different devices or a system with different functions. Here, the RGB devices 1002*a* has a horizontal orientation.

However, they can have different orientation. Also, the spatial variation is applied to RGB samples 1002*b* in the same order. However, each device can have different spatial variation. Also, spare device 1004*a* is added to some spaces between the actual functional devices. The spare devices 1004*b* can have also spatial variation.

Figure 10C:
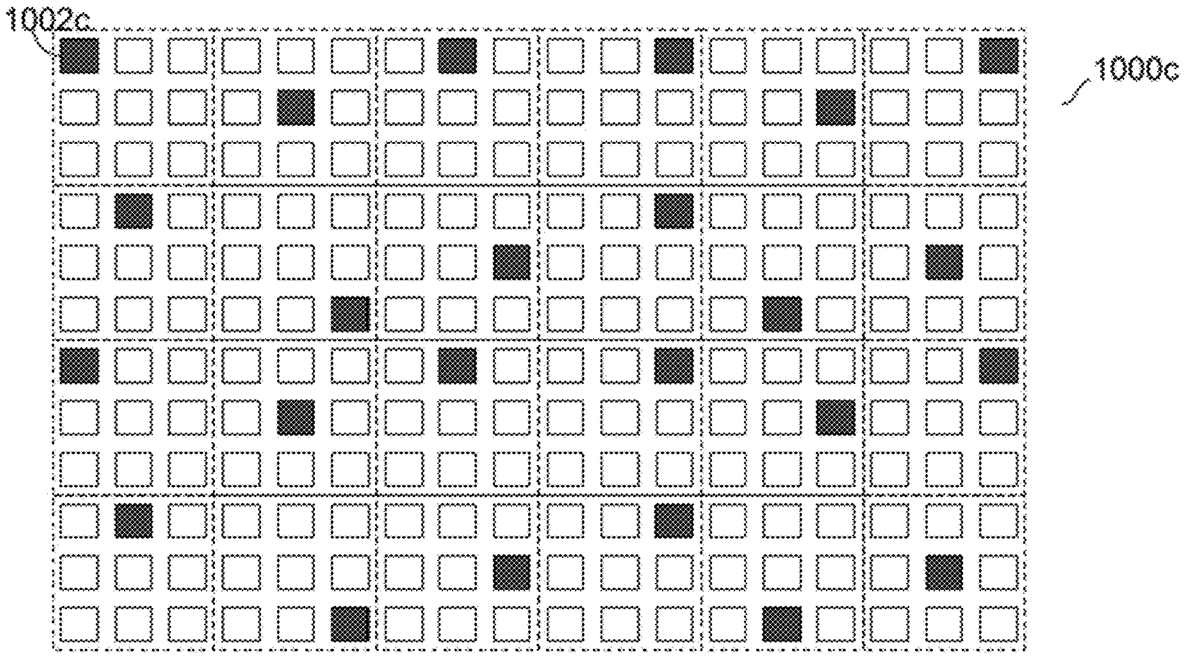
FIG. 10*c* shows an example of transferring different micro-devices from the source to the system substrate.

FIG. 10*c* shows an example of transferring different micro-devices from the source to the system substrate. In one approach, a method to create the spatial variation is to fabricate the micro-devices with induced spatial variation. Here, the system substrate 1000*c* where the micro-devices 1002*c* will be transferred after fabrication of micro devices have similar variation in the landing areas in the system substrate where the micro-devices will be transferred.

Figure 10D:
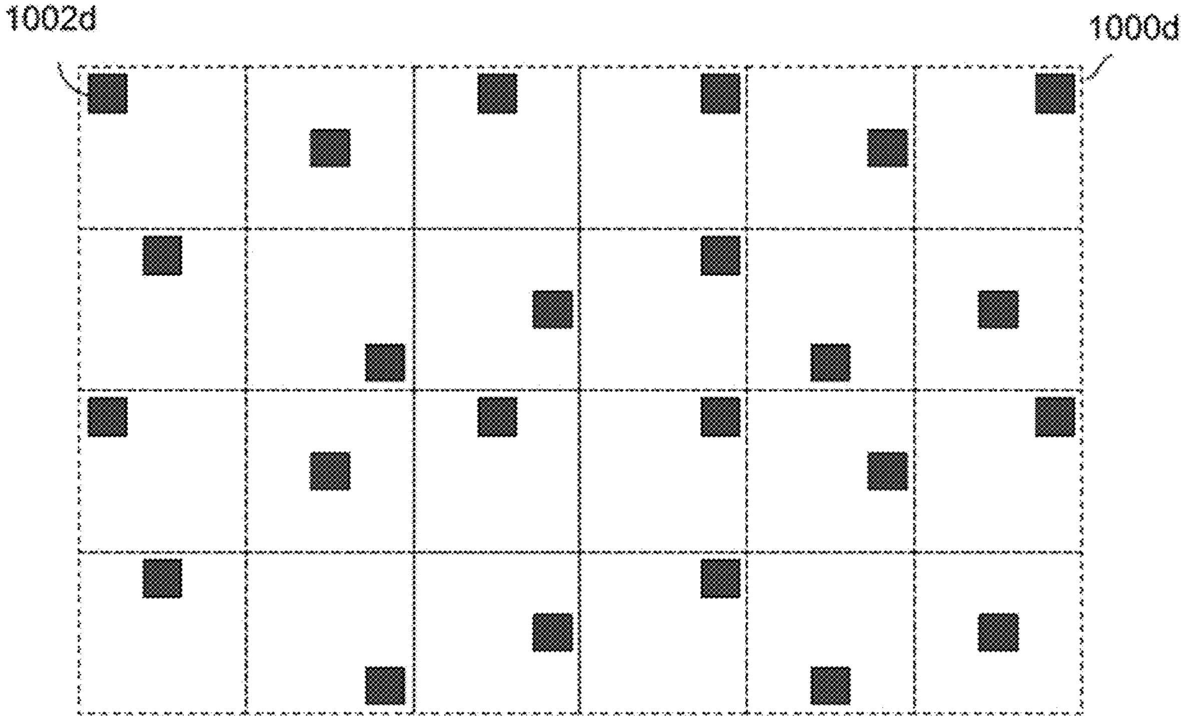
FIG. 10*d* shows a system substrate with landing area that corresponds to the variation in the micro-devices from the source.

FIG. 10*d* shows a system substrate with landing area array 1000*d* that corresponds to the variation in the micro-devices from the source. In another method, the transfer process accommodate the variation. Here, the micro-devices such as 1002*d* are sitting in a two-dimensional array structure which has smaller pitch than the pitch of the 2-dimensional landing-area array 1000*d* in the system substrate. The transfer method used here is a process of the transferring micro-devices with different pitch from the micro-device source into the landing array. Here, the landing array can accommodate different micro-device pitch. Either the landing area is large to accommodate such variation or the landing area has similar pitch variation.

In another embodiment, to further improve the uniformity, the induced variation is limited to the extent of allowable non-uniformity in the signals of the micro-devices. The allowable spatial non-uniformity can be global non-uniformity where it is calculated based on the average micro-device signals in areas that include more than one micro-devices. The allowable spatial non-uniformity can be local non-uniformity where it is based on the variation in perceived signals of adjacent micro-devices.

In yet another embodiment, to eliminate the unwanted non-uniformity induced by the variation in the coordination of the micro-devices, it may include a calibration of the system for the induced variation. The calibration may include modifying the signals of the micro-device based on the position of the micro-devices.

The orientation and place of the micro devices in pixels are used as an exemplary arrangement and different arrangements can be used for the aforementioned methods.

Figure 11:
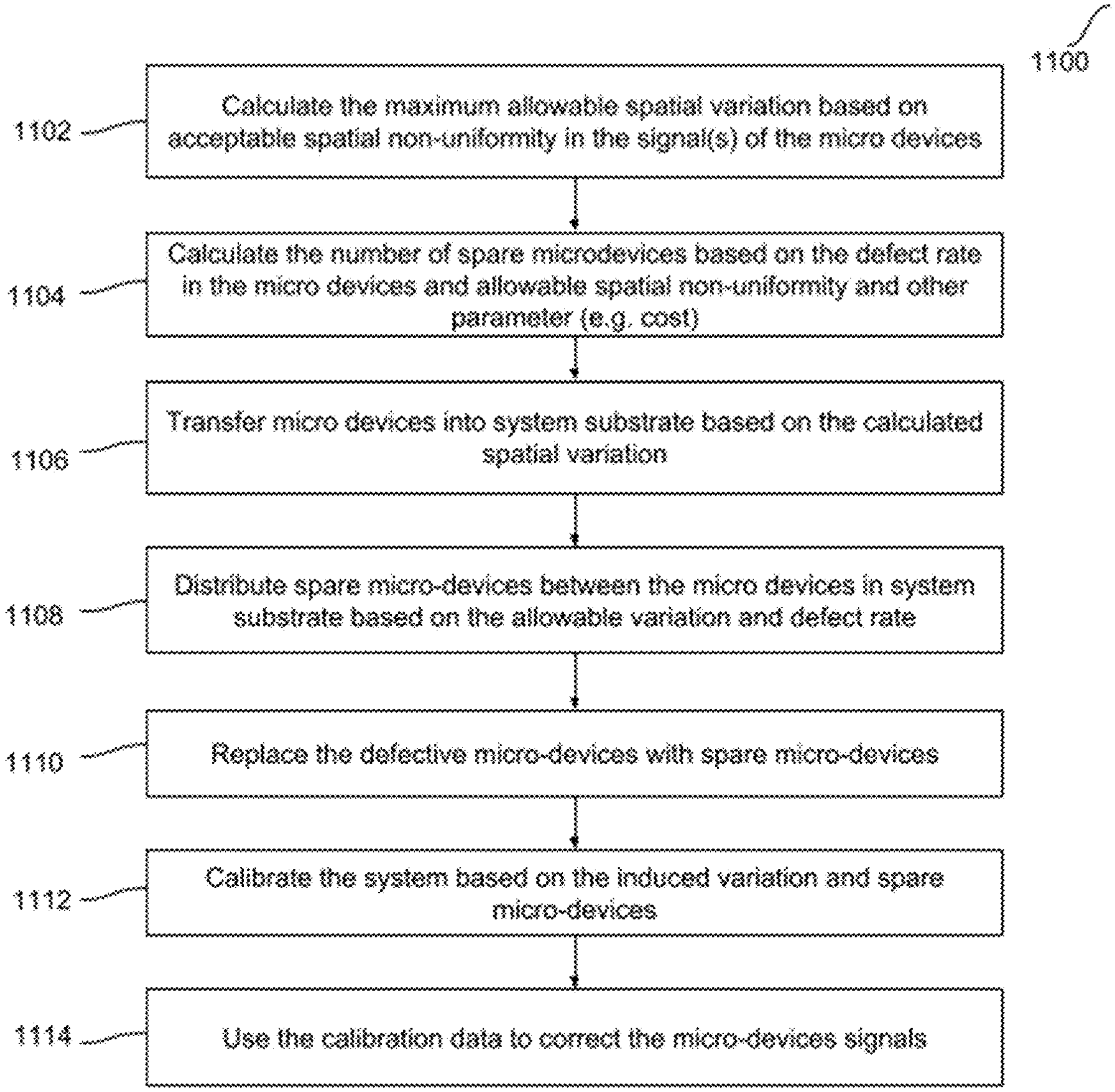
FIG. 11 demonstrated order of the steps to spatial variation to the position of micro-devices in a display system.

FIG. 11 demonstrates a flow chart 1100 including steps of creating the spatial variation and to eliminate the unwanted non-uniformity induced by the variation. The order of the steps demonstrated in FIG. 11 can be varied without affecting the system performance. FIG. 11 shows one example of the steps. First step 1102 includes calculating the maximum allowable spatial variation based on acceptable spatial non-uniformity in the signal(s) of the micro devices. During step 1104, the number of spare microdevices may be calculated based on the defect rate in the micro devices and allowable spatial non-uniformity and other parameter (e.g. cost). During step 1106, micro devices may be transferred into system substrate based on the calculated spatial variation and distribute the spare micro-devices between the micro devices in system substrate based on the allowable variation and defect rate during step 1108. During step 1110, replace the defective micro-devices with spare micro-devices. During step 1112, the system may be calibrated based on the induced variation and spare micro-devices and use the calibration data to correct the micro-devices signals during step 1114.

Figure 12:
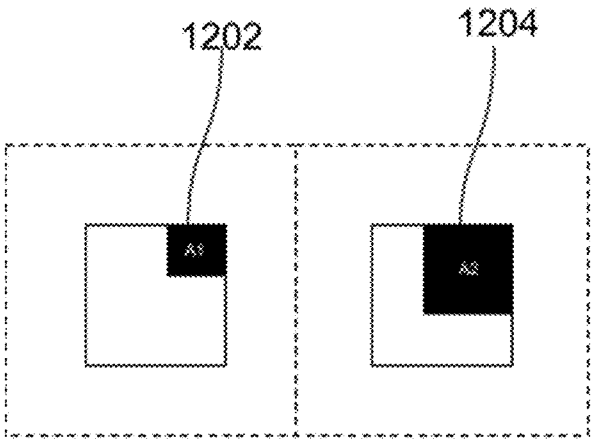
FIG. 12 shows a random spatial variation to the position of micro-devices in a display system.

FIG. 12 shows a method of correction for at least a portion of different non-uniformities such as the non-uniformity from the spatial variation, non-uniformity from the device process, non-uniformity from the system substrate or from the integration process of micro device into the system substrate. Here, part of the signals created or absorbed by the micro-devices is blocked. The area (A1) 1202 that blocks the signal is proportional to the signal of the micro-device.

In one embodiment, it is created before the transfer as part of either device process or integration process. If it is part of the device process, the micro device performance or the layers prior to creating micro devices is evaluated. After the evaluation, during the device process, either an opaque material is used to block the signal or the area A1 of the device is modified to area (A2) 1204 to correct for the measured non-uniformity in the performance.

In another embodiment, the blocked area 1204 is created after the device is transferred into the system substrate. In this case, the device performance is measured after transfer or prior to the transfer at different stages. Then, the data is used to create opaque layers that block of the signals or the area A2 of the device is tuned to correct of the measured non-uniformity in the performance.

In one embodiment, the opaque layer is deposited and patterned on top of a optoelectronic device where an area of the opaque layer is proportional to the spatial non-uniformity. The opaque layer may be a part of a contact layer of the optoelectronic device. In another case, the opaque layer is part of an electrode of the array. Also, a size of optoelectronic device size is modified according to the spatial non-uniformity.

In one embodiment, after identifying a set of defective micro devices, the type of microdevice in at least one pixel can be remapped based on defective micro devices. For example, in a display pixel, the type of the microdevice may be one of a red, blue or green micro LED. In this case, based on the defect in one micro LED, the other micro LEDs can be mapped to different colors to reduce the effect of defects. In one case, based on the remapped information, programming data is sent to the corresponding data line. For example, if in a pixel, the micro-LED allocated to red is defective and the spare micro LED (or one of other micro LED) is mapped to be red, the red data will be redirected to the circuit allocated to that newly mapped red micro LED. The remapping can happen through sending the data to the data line corresponding to the newly mapped micro LED. In another case, the connections between each micro device and corresponding pixel circuits is rearranged based on remapped information. In one embodiment, the microdevices may be connected to the bonding area connecting the micro device to a backplane according to mapping information after defect analysis. The bonding area may comprise bond pads/bumps or metallization through vias between microdevice plane and backplane.

An optoelectronic system made of micro devices includes an array of micro devices, an input unit for getting the input data (e.g. video data), a data processing unit for processing the input or output data, a timing controller synchronizing the addressing of micro devices in the array with the input or output data, driver units to set the data lines in the array with values representing the input data, and address driver for enabling micro devices in the array for different operation phases (e.g. programming, driving or calibration).

Figure 13:
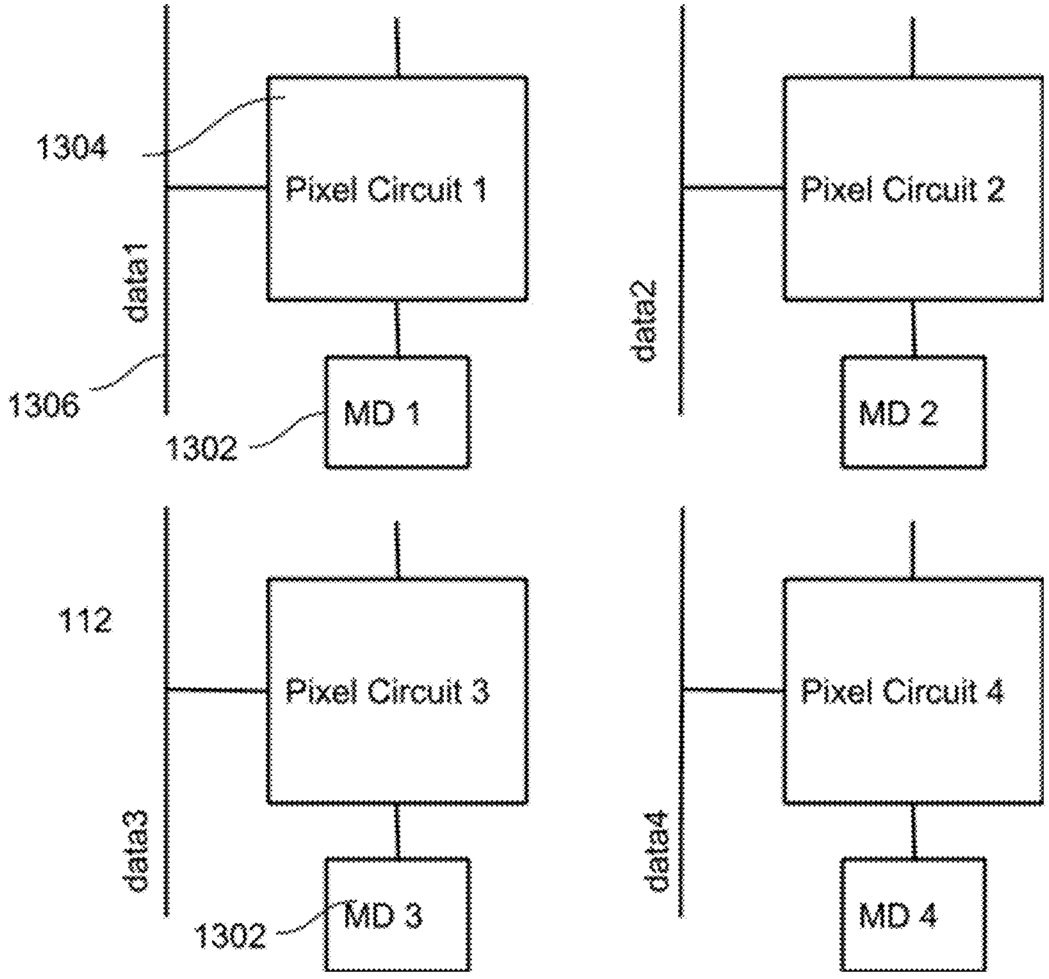
FIG. 13 shows a schematic diagram of micro devices arranged with circuitry, in accordance with an embodiment of the present invention.

FIG. 13 shows a schematic diagram of micro devices arranged with pixel circuitry, in accordance with an embodiment of the present invention. Here, a plurality of micro devices 1302 (MD1, MD2, MD3, MD4) may be connected to their corresponding pixel circuits 1304 and data lines 1306. In one case, the connections are fixed between the pixel circuits 1304, data lines (or other signal lines) 1306 and microdevices 1302. In this case, if the type of the microdevice (e.g., red, green, or blue) are rearranged, the programming data to the data lines 1306 of the pixel circuits 1304 (or other signals) need to be redirected at the programing side in the data processing or timing controller or driver unit.

Figure 14:
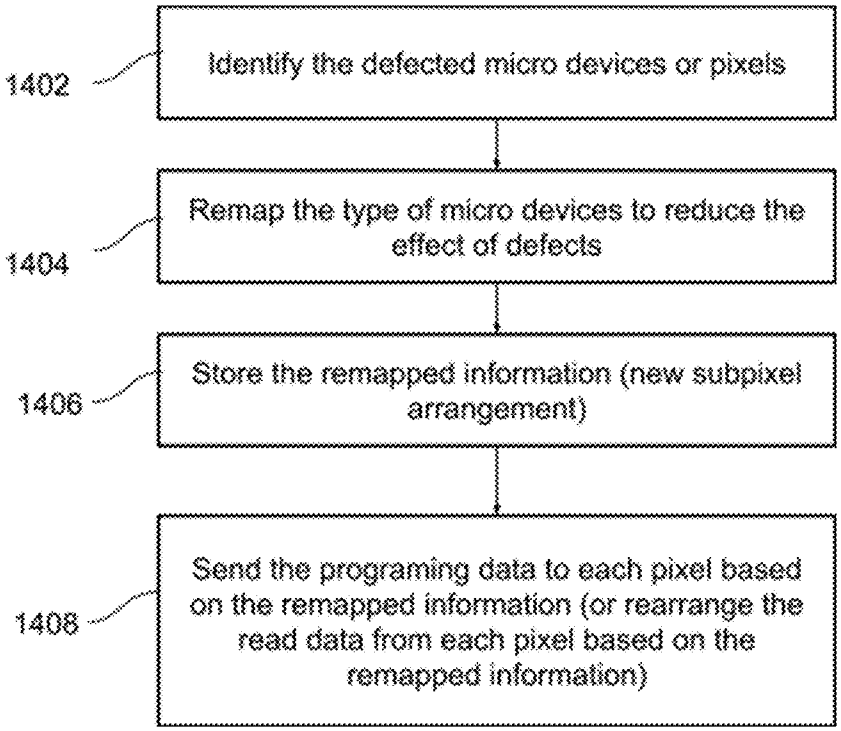
FIG. 14 demonstrated order of the steps to remapping the subpixels, in accordance with an embodiment of the present invention.

FIG. 14 demonstrated order of the steps to remapping the subpixels, in accordance with an embodiment of the present invention. At step 1402, a set of defective micro devices or pixels may be identified from an array of micro devices. At next step 1404, to reduce the effect of defects, the type of micro devices may be remapped. At next step 1406, the remapped information (new subpixel arrangement) may be stored and at step 1408, the programming data to each pixel based on the remapped information (or rearrange the read data from each pixel based on the remapped information) may be sent at the programing side in the data processing or timing controller or driver unit.

Figure 15:
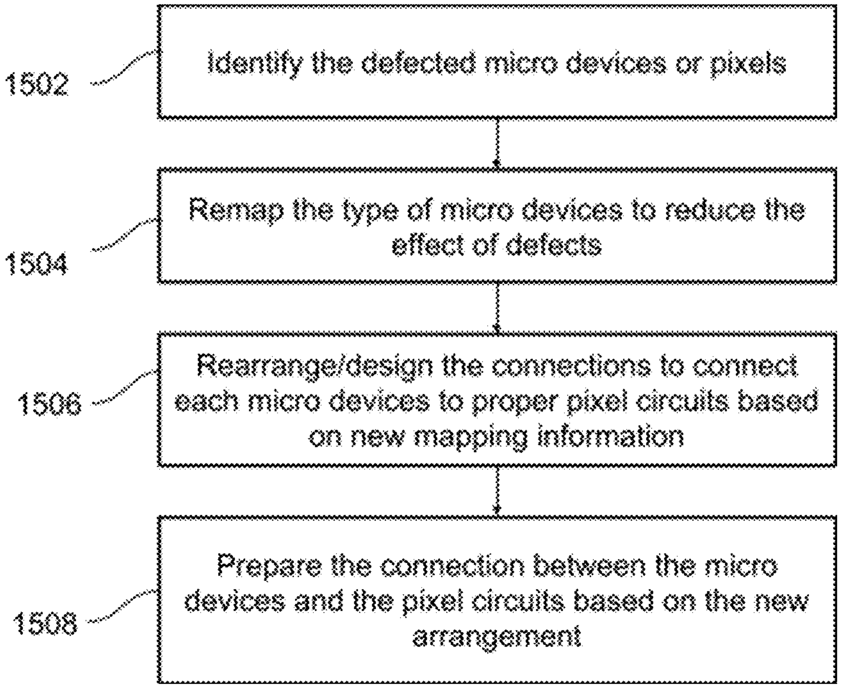
FIG. 15 demonstrated order of the steps to remapping the subpixels, in accordance with another embodiment of the present invention.

FIG. 15 demonstrated order of the steps to remapping the subpixels, in accordance with another embodiment of the present invention. At step 1502, a set of defective micro devices or pixels may be identified. At next step 1504, to reduce the effect of defects, the type of micro devices may be remapped. At the next step 1506, the connections to connect each micro device to corresponding pixel circuits based on the new mapping information may be rearranged/redesigned; and further at next step 1508, the connection between the micro devices and the pixel circuits based on the new arrangement may be implemented.

Figure 16:
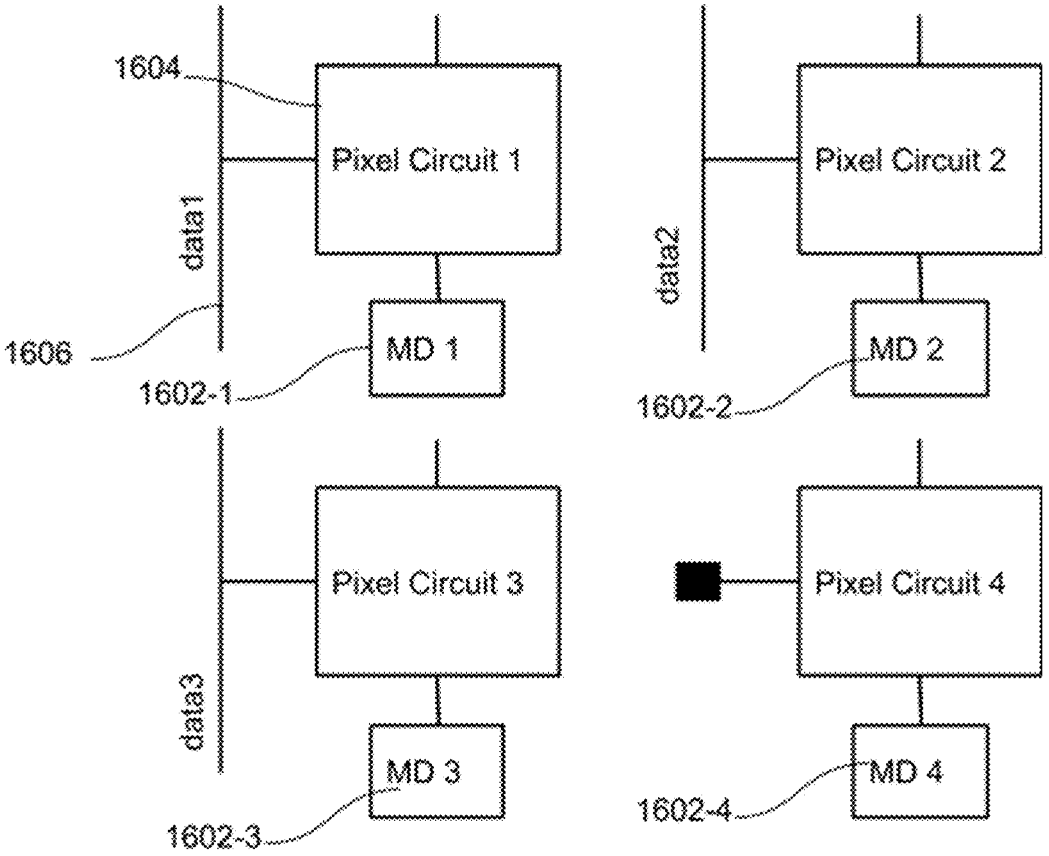
FIG. 16 shows a schematic diagram of micro devices arranged with circuitry, in accordance with another embodiment of the present invention.

FIG. 16 shows a schematic diagram of micro devices arranged with pixel circuitry, in accordance with another embodiment of the present invention. Here, a plurality of micro devices 1602-1, 1602-2 and 1602-3 may be connected to their corresponding pixel circuits 1604 and data lines 1606. In one case, at least one micro device/pixel (for example, 1602-4) is not hardwired to a data (or signal) line. The type of this micro device can change according to the defect information. Based on the mapping of the microdevice type (e.g., red, green, or blue) to that pixel (subpixel), the pixel gets connected to the corresponding data line.

Figure 17:
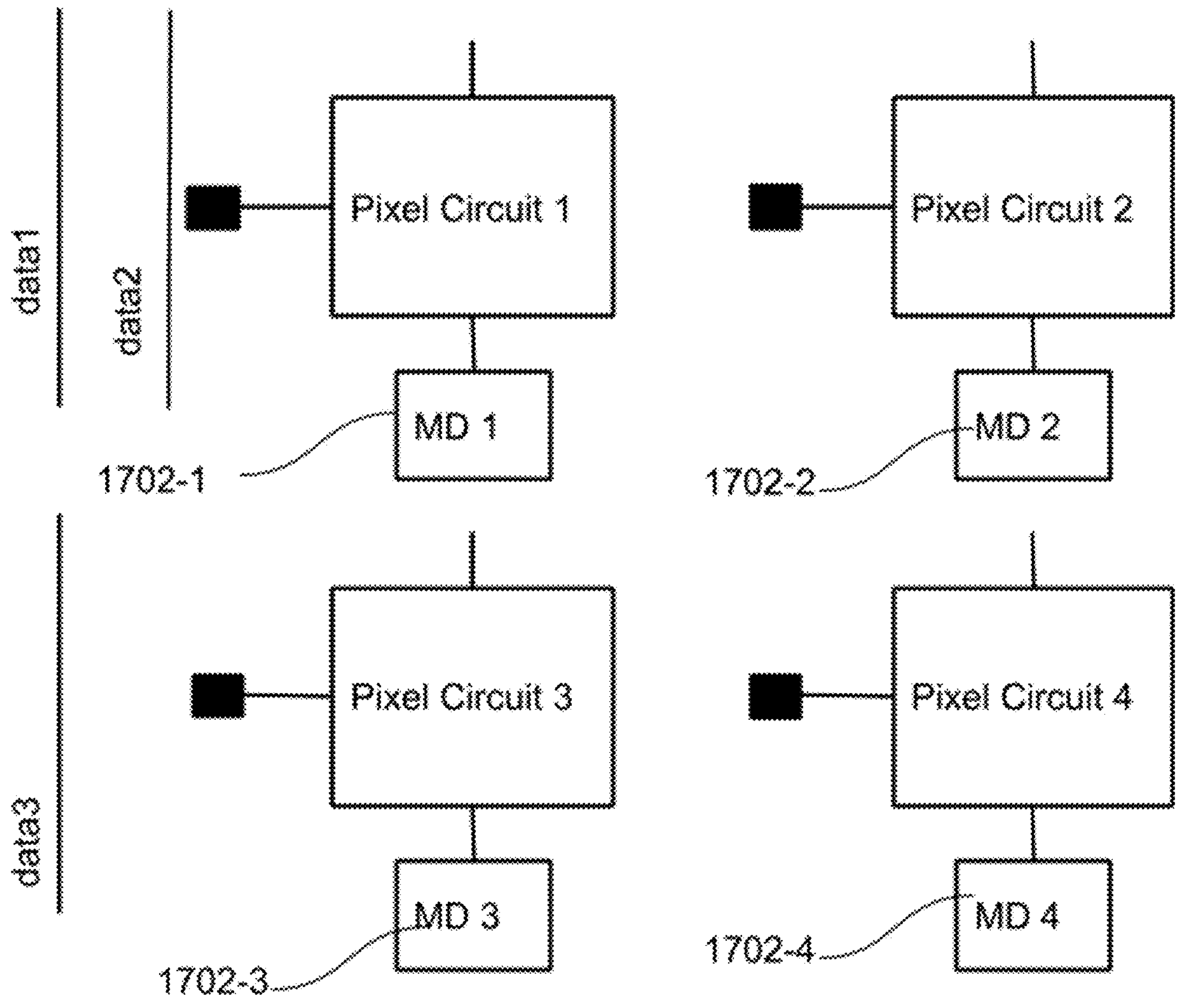
FIG. 17 shows a schematic diagram of micro devices arranged with circuitry, in accordance with another embodiment of the present invention.

FIG. 17 shows a schematic diagram of micro devices arranged with pixel circuitry, in accordance with another embodiment of the present invention. In another case, more than one pixels (or subpixels) e.g., 1702-1, 1702-2, 1702-3, 1702-4 are not hardwired to a data line (or signal line). Based on the micro device mapping after defect analysis, the pixels (sub pixels) may be connected to a corresponding data line (or signal line).

Figure 18:
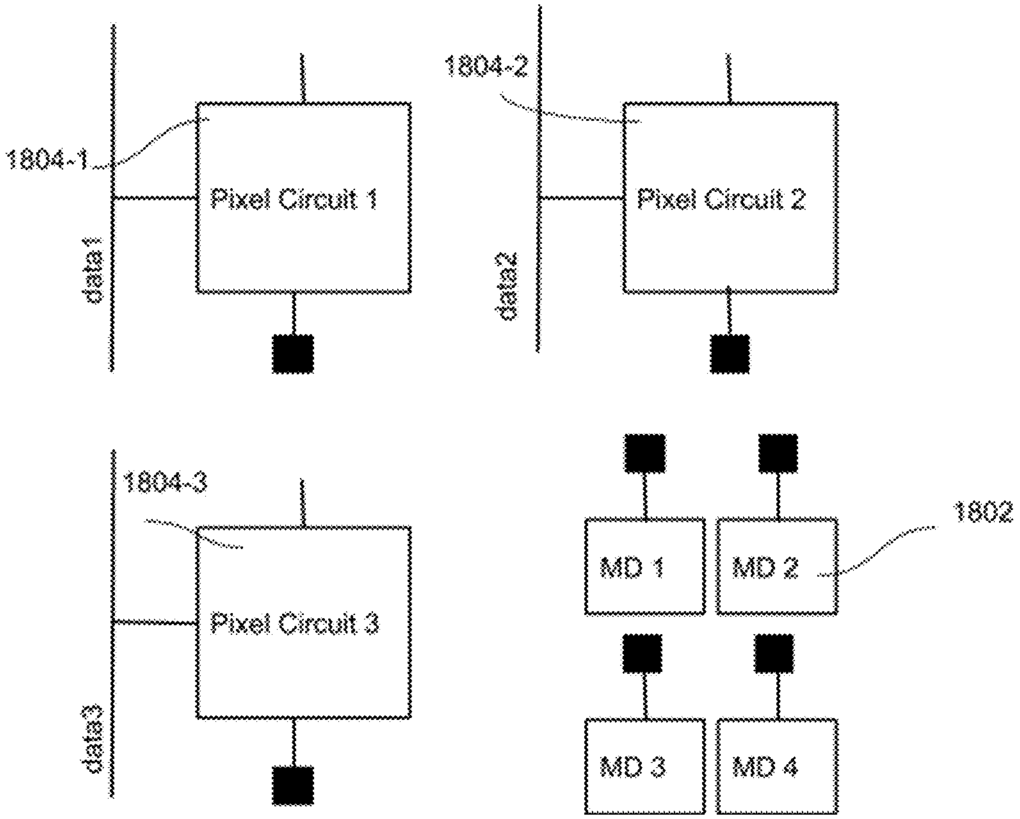
FIG. 18 shows a schematic diagram of micro devices arranged with circuitry, in accordance with another embodiment of the present invention.

FIG. 18 shows a schematic diagram of micro devices arranged with pixel circuitry, in accordance with another embodiment of the present invention. In another case, the pixel circuits (sub pixels) e.g., 1804-1, 1804-2, and 1804-3 are not hardwired to the micro devices. After mapping the type of each micro device based on the defect analysis, micro devices 1802 are connected to the pixel circuits accordingly. It is possible that more than one micro device may be connected to the same circuit or a micro device may not be connected to any pixel circuit.

Figure 19:
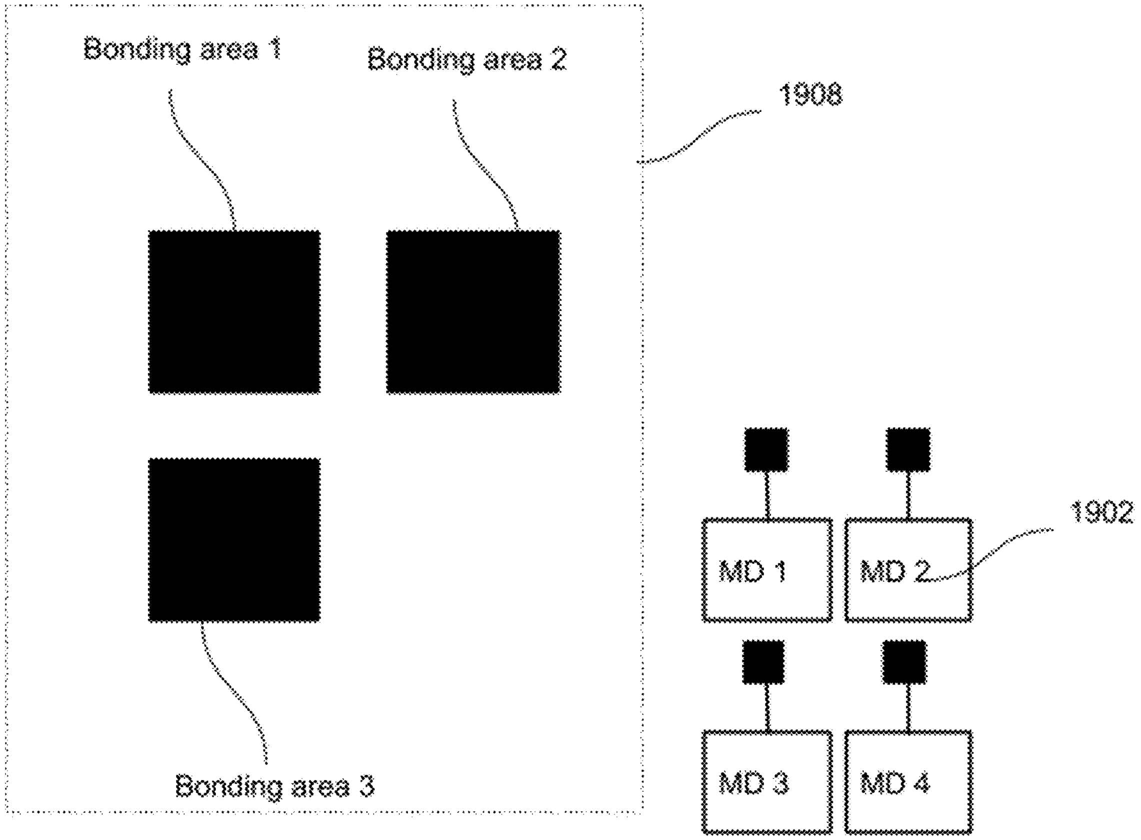
FIG. 19 shows a schematic diagram of micro devices arranged with circuitry, in accordance with another embodiment of the present invention.

FIG. 19 shows a schematic diagram of micro devices arranged with pixel circuitry, in accordance with another embodiment of the present invention. In one case, the micro-LED plane can have bonding area 1908 corresponding to the bonding area of pixel circuits (subpixels) in the backplane. The microdevices 1902 are connected to the bonding area 1908 according to the type allocated to them after defect analysis. The bonding area can be VIA for metallization between microdevice plane and backplane or bond pads (bumps). In another case, the bonding area on the backplane can be adjusted according to the defect analysis.

In accordance with one embodiment, a display system on a system substrate may be provided. The display system may comprise an array of pixels, wherein each pixel comprising a group of subpixels arranged in a matrix; the group of sub-pixels comprising at least one defective sub-pixel; and a defect mapping block to map data from the at least one defective sub-pixel to at least one surrounding spare sub-pixel.

In accordance with some embodiments, a brightness value of the defective sub-pixel may be shared between surrounding spare sub-pixels based on predefined values. A lookup table or a formula may be used to extract the brightness share of the surrounding spare sub-pixels. A brightness value of the defective sub-pixel may shared to one of the surrounding spare sub-pixel with closest geometric distance from the defective subpixel. A brightness value of the defective sub-pixel may shared equally between the surrounding spare sub-pixels.

In accordance with another embodiment, a method of repairing a pixel circuit comprising a plurality of pixels may comprising, providing a group of more than two sub-pixels and a spare sub-pixel for each pixel, detecting at least one defective sub-pixel in the group of the sub-pixels, and converting the spare sub-pixel with a color conversion or color filter to create a color same as that of the defective sub-pixel.

In accordance with some embodiments, the group of sub-pixels may comprise a red sub-pixel, a green sub-pixel and a blue sub-pixel. The spare sub-pixel may comprise a blue sub-pixel or a combined-color sub-pixel.

In another case, the method may further comprise providing the color conversion material to convert the spare blue sub-pixel to the same primary color as of the defective sub-pixel. The color conversion material is one of: a quantum dot or a phosphor. The color conversion material may covered the spare blue sub-pixel by one of: a printing process, a patterning process or a stamping process.

In yet another case, the method may further comprise providing the color filter to convert the spare combined-color sub-pixel to the same primary color as of the defective sub-pixel.

A further embodiment provides a method of repairing a pixel circuit may be provided. The method may comprise providing a pixel comprises more than one primary sub-pixels with high wavelength emission (e.g. blue), applying a color conversion material to at least one of the primary sub-pixels to convert the high wavelength emission into a different emission wavelength from the high wavelength emission, identifying a defective sub-pixel in the primary sub-pixels; and mapping a spare sub-pixel to a same primary color as of the defective primary sub-pixel by using the color conversion material.

In accordance with yet another embodiment, a method of repairing a pixel circuit may be provided. The method may comprising providing a pixel comprises more than one primary sub-pixels with combined wavelength emission (e.g. white), applying a color filter material to at least one of the primary sub-pixels to convert the combined-wavelength emission into a different emission wavelength; identifying a defective sub-pixel in the primary sub-pixels; and mapping the spare sub-pixel to the same primary color as of the defective primary sub-pixel by using the color filter material.

In accordance with some embodiment, a method of repairing a pixel circuit may be provided. The method may comprising providing a pixel comprises at least one high-wavelength (e.g. blue) primary sub-pixels, providing at least one spare sub-pixel with a same wavelength, identifying a defective sub-pixel in the primary and the spare sub-pixels; and mapping a color conversion layer to the sub-pixels without the defect so that there is at least on sub-pixel for each intended primary sub-pixels.

In accordance with another embodiment, a method of repairing a pixel circuit may be provided. The method may comprising providing a pixel comprises at least one combined-color sub-pixels (e.g. white), providing at least one spare sub-pixel with the same combined-color, identifying a defective sub-pixel in the primary and the spare sub-pixels; and mapping a color filter layer to the sub-pixels without the defect so that there is at least one sub-pixel for each intended primary sub-pixels.

In accordance with yet another embodiment, a method to replace defective sub-pixels with spare sub-pixels in a display system may comprising providing a periodic spatial variation to a position of sub-pixels in the display, calculating a maximum and a minimum distance between the spare sub-pixels and the defected sub-pixels, extracting a variation in coordinates of sub-pixels; and replacing the defective micro-devices with the spare sub-pixels based on the calculated variation.

In accordance with some embodiment, the extracting the variation in the coordinates of sub-pixels may comprising the steps of calculating a maximum allowable spatial variation based on a acceptable spatial non-uniformity in signals of the sub-pixels, calculating the number of spare sub-pixels based on a defect rate in the sub-pixels and the maximum allowable spatial non-uniformity, transferring sub-pixels into a system substrate based on the calculated spatial variation; and distributing the spare sub-pixels between the sub-pixels in system substrate based on the maximum allowable variation and the defect rate.

In accordance with other embodiments, the method may further comprise replacing the defective sub-pixels with spare sub-pixels, calibrating the system based on the induced variation and spare sub-pixels, and using the calibration data to correct the sub-pixels signals.

In accordance with yet another embodiment, a method of correcting spatial non-uniformity of an array of optoelectronic devices, wherein a part of the signals created or absorbed by the optoelectronic devices is blocked based on the spatial non-uniformity in said array.

In another case, an opaque layer is deposited and patterned on top of an optoelectronic device where an area of the opaque layer is proportional to the spatial non-uniformity. The opaque layer is part of a contact layer of the optoelectronic device. The opaque layer may part of an electrode of the array. Also, a size of optoelectronic device size is modified according to the spatial non-uniformity.

Optoelectronic Solid State Array

The present disclosure is also related to micro device array display device, wherein the micro device array may be bonded to a backplane with a reliable approach. The micro devices are fabricated over a micro device substrate. The micro device substrate may comprise micro light emitting diodes (LEDs), inorganic LEDs, organic LEDs, sensors, solid state devices, integrated circuits, microelectromechanical systems (MEMS), and/or other electronic components.

Light Emitting Diodes (LED) and LED arrays can be categorized as a vertical solid state device. The micro devices may be sensors, Light Emitting Diodes (LEDs) or any other solid devices grown, deposited or monolithically fabricated on a substrate. The substrate may be the native substrate of the device layers or a receiver substrate where device layers or solid state devices are transferred to.

The receiver substrate may be any substrate and can be rigid or flexible. The system substrate may be made of glass, silicon, plastics, or any other commonly used material. The system substrate may also have active electronic components such as but not limited to transistors, resistors, capacitors, or any other electronic component commonly used in a system substrate. In some cases, the system substrate may be a substrate with electrical signal rows and columns. The system substrate may be a backplane with circuitry to derive microLED devices.

To improve the pixelation or adjust the light output profile, one or more of the bottom layers after the separation of the donor substrate (or the carrier substrate) is being patterned. The resolution of the patterned bottom layers is at least the same as the pixel resolution (however, it can be higher resolution). The patterning can be done to fully isolating the layers or it can leave some thin layers between the patterns. In both cases, to get connection to those layers, a common electrode (or patterned electrode) can be used.

Figure 20A:
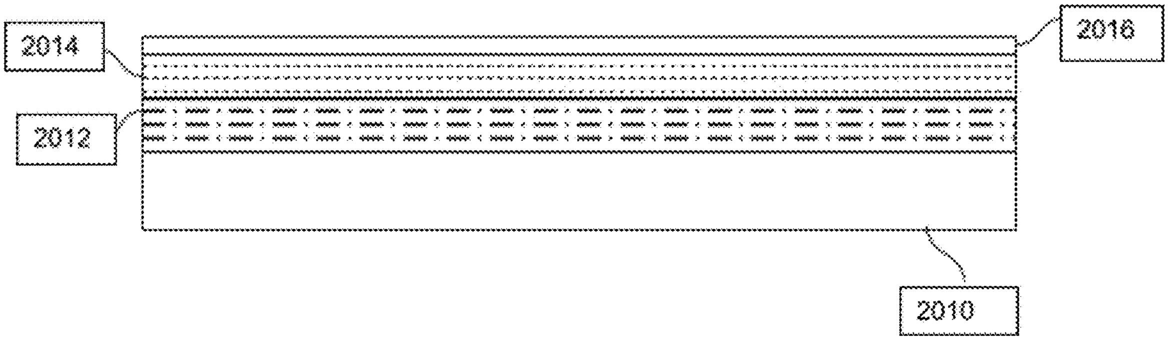
FIG. 20A illustrates a cross-sectional view of a lateral functional structure on a donor substrate, in accordance with an embodiment of the present invention.

FIG. 20A illustrates an embodiment including a donor substrate 2010 with a lateral functional structure comprising a bottom planar of sheet conductive layer 2012, a functional layer, e.g. light-emitting quantum wells 2014, and a top pixelated conductive layer 2016. The conductive layers 2012 and 2016 may be comprised of doped semiconductor material or other suitable types of conductive layers. The top conductive layer 2016 may comprise a few different layers.

Figure 20B:
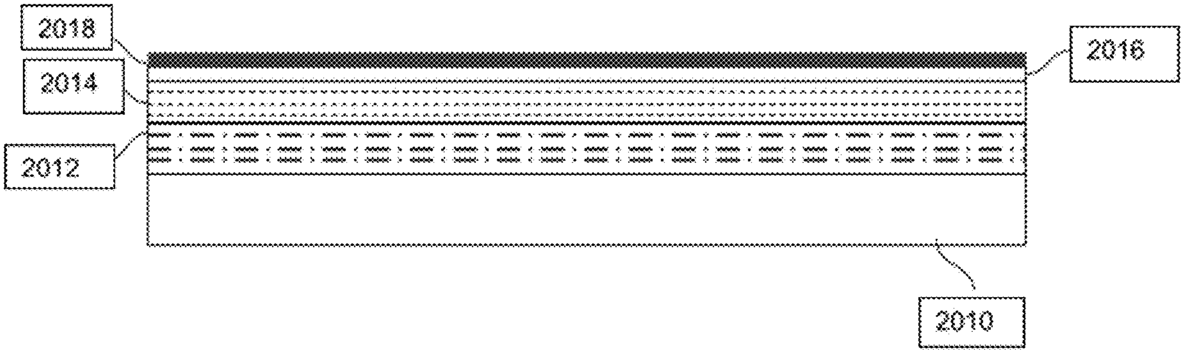
FIG. 20B illustrates a cross-sectional view the lateral structure of FIG. 1A with a current distribution layer deposited thereon, in accordance with an embodiment of the present invention.

In one embodiment, as shown in FIG. 20B, a current distribution layer 2018 is deposited on top of the conductive layer 2016. The current distribution layer 2018 may be patterned. In one embodiment, the patterning may be done through lift off. In another case, the patterning may be done through photolithography. In an embodiment, a dielectric layer may be deposited and patterned first and then used as a hard mask for patterning the current distribution layer 2018. After the patterning of current distribution layer 2018, the top conductive layer 2016 may be patterned as well forming a pixel structure.

Figure 20C:
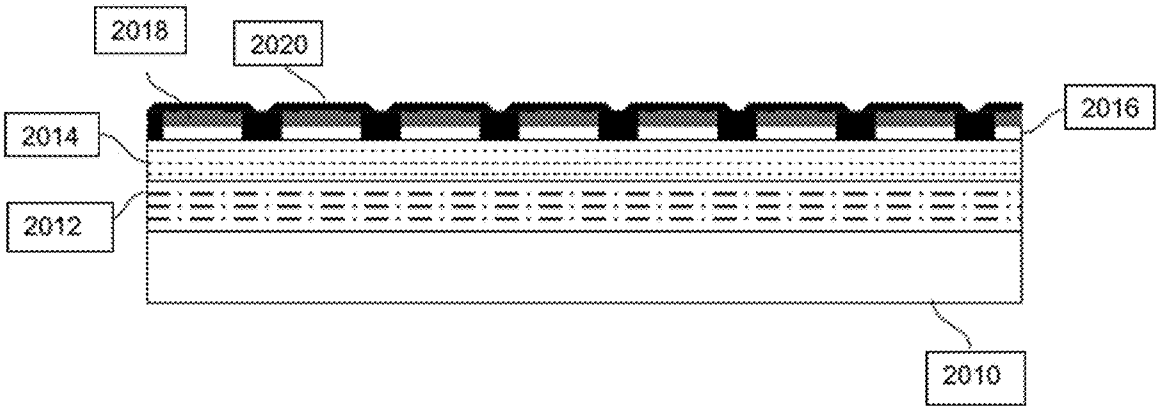
FIG. 20C illustrates a cross-sectional view of the lateral structure of FIG. 1B after patterning the dielectric, top conductive layer, and deposition of a second dielectric layer, in accordance with an embodiment of the present invention.

A final dielectric layer 2020 may be deposited over and between the patterned conductive and current distribution layers 2016 and 2018, after patterning the current distribution layer 2018 and/or conductive layer 2016, as shown in FIG. 20C.

Figure 20D:
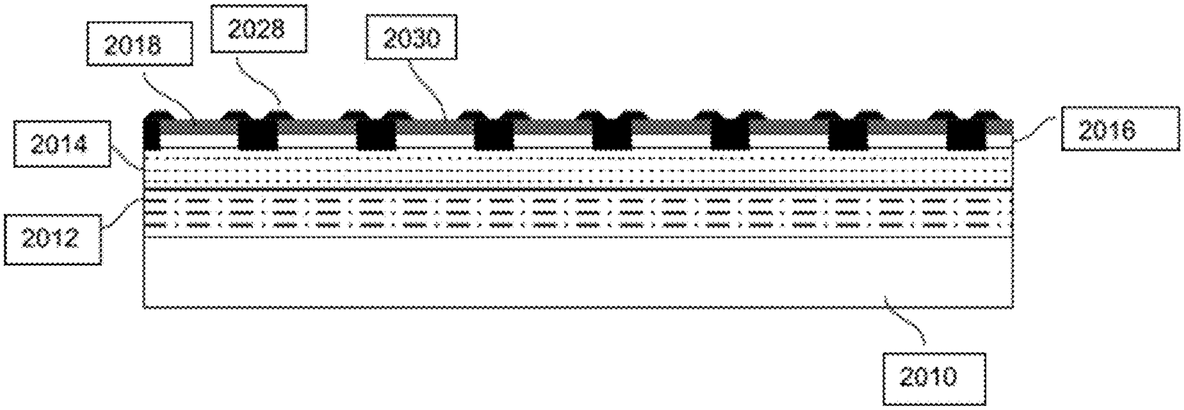
FIG. 20D illustrates a cross-sectional view of the lateral structure after patterning of the second dielectric layer, in accordance with an embodiment of the present invention.

The dielectric layer 2020 can also be patterned to create openings 2030 as shown in FIG. 20D providing access to the patterned current distribution layers 2018. Additional leveling layers 2028 may also be provided to level the upper surface, as shown in FIG. 20E.

Figure 20E:
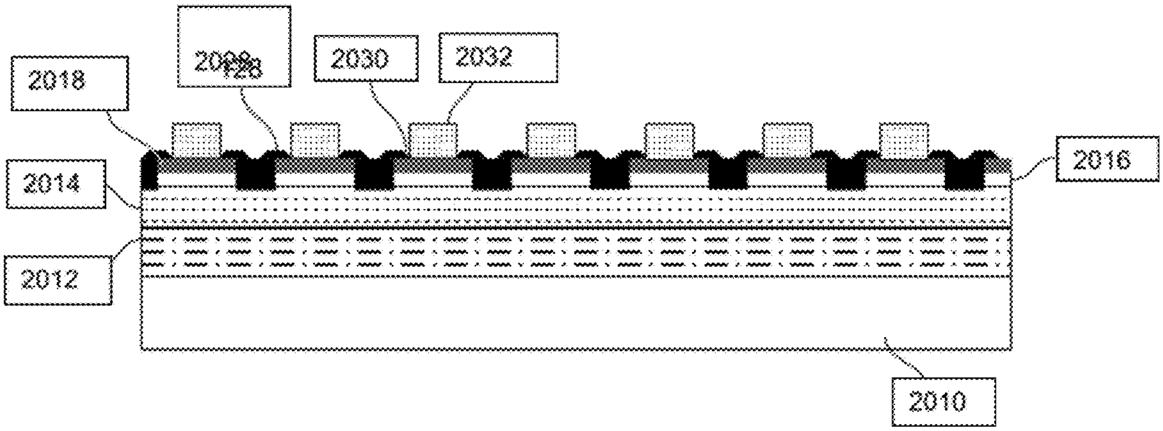
FIG. 20E illustrates a cross-sectional view of the lateral structure after deposition and patterning of pads, in accordance with an embodiment of the present invention.
Figure 20F:
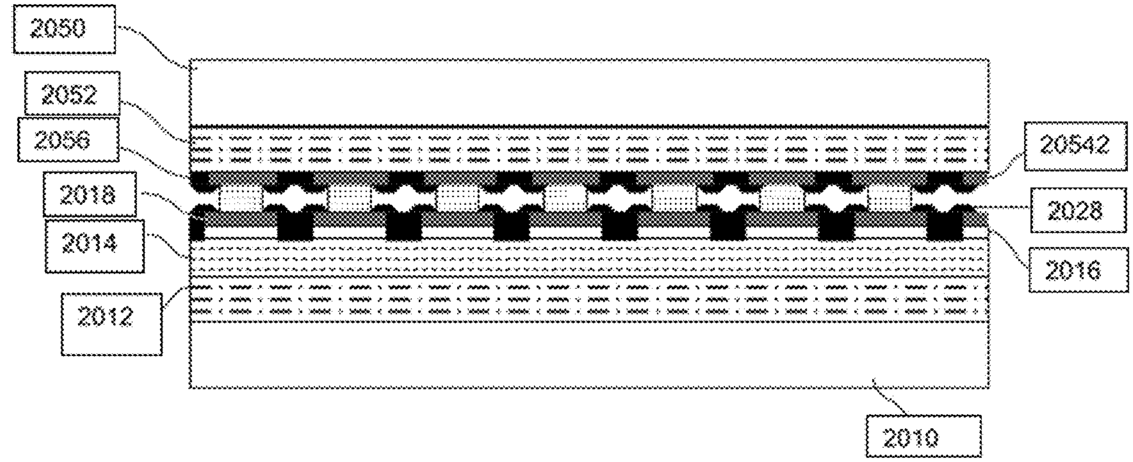
FIG. 20F illustrates a cross-sectional view of the lateral structure after bonding to a system substrate with bonding areas forming an integrated structure, in accordance with an embodiment of the present invention.

As shown in FIG. 20E, a pad 2032 is deposited on the top of the current distribution layer 2018 in each opening 2030. The developed structure with pads 2032 is bonded to the system substrate 2050 with pads 2054, as shown in FIG. 20F. The pads 2054 in the system substrate 2050 may be separated by a dielectric layer 2056. Other layers 2052 such as circuitry, planarization layers, conductive traces may be between the system substrate pads 2054 and the system substrate 2050. The bonding of the substrate system pads 2054 to the pads 2032 may be done either through fusion, anodic, thermocompression, eutectic, or adhesive bonding. There can also be one or more other layers deposited in between the system and lateral devices.

The above described one case for pixelating the lateral functional structure from the top layers. However, the pixelation of the lateral structure from the top can be done differently.

To improve the pixelation or adjust the light output profile, one or more of the bottom layers after the separation of the donor substrate (or the donor substrate) is being patterned. The resolution of the patterned bottom layers is at least the same as the pixel resolution (however, it can be higher resolution). The patterning can be done to fully isolating the layers or it can leave some thin layers between the patterns. In both cases, to get connection to those layers, a common electrode (or patterned electrode) can be used.

Figure 20G:
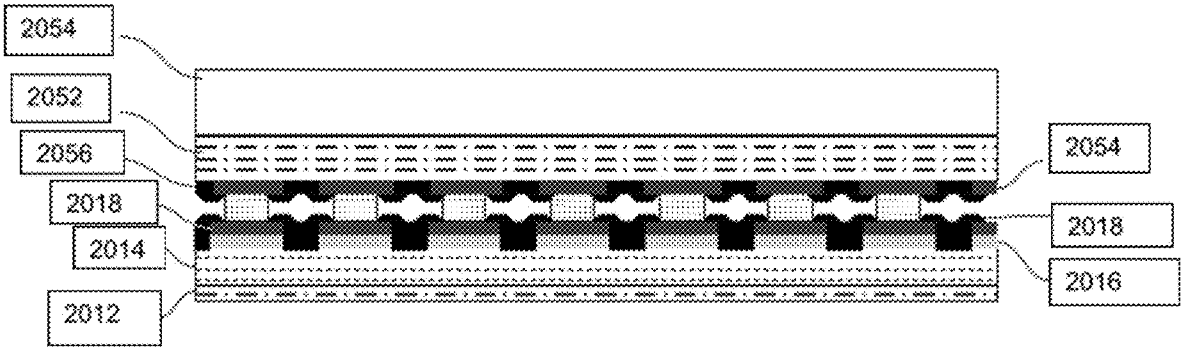
FIG. 20G illustrates a cross-sectional view of the integrated structure after removing the donor substrate and thinning the bottom electrode, in accordance with an embodiment of the present invention.

As shown in FIG. 20G, the donor substrate 2010 may be removed from the lateral functional devices, e.g. the conductive layer 2012. The conductive layer 2012, may be thinned and/or partially or fully patterned. In this case, the conductive layer 2012 is thinned.

In some embodiments, a reflective layer or black matrix may be deposited and patterned to cover the areas on the conductive layer 2012 between the pixels. After this stage, other layers may be deposited and patterned depending on the function of the devices. For example, a color conversion layer may be deposited in order to adjust the color of the light produced by the lateral devices and the pixels in the system substrate 2050. One or more color filters may also be deposited before or/and after the color conversion layer. The dielectric layers, e.g. dielectric layer 2020, in these devices may be organic, such as polyamide, or inorganic, such as SiN, SiO2, Al2O3, and others. The deposition may be done with different process such as Plasma-enhanced chemical vapor deposition (PECVD), Atomic layer deposition (ALD), and other methods. Each layer may be a composition of one deposited material or different material deposited separately or together. The bonding materials may be deposited only as part of the pads 2032 of donor substrate 2010 or the system substrate pads 2054. There can also be some annealing process for some of the layers. For example, the current distribution layer 2018 may be annealed depending on the materials. In one example, the current distribution layer 2018 maybe annealed at 500 C for 10 minutes. The annealing may also be done after different steps.

Figure 20H:
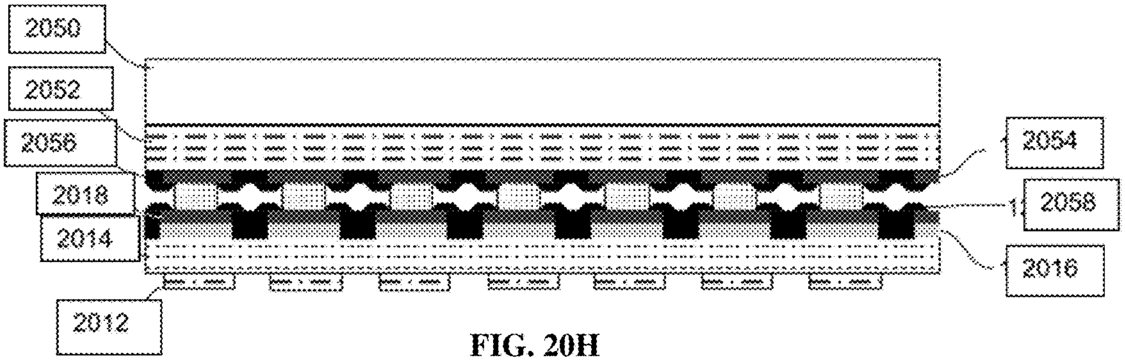
FIG. 20H illustrates a cross-sectional view of the integrated structure after removing the donor substrate and patterning the bottom electrode, in accordance with an embodiment of the present invention.

As shown in FIG. 20H, the donor substrate 2010 may be removed from the lateral functional devices and the conductive layer 2012 is fully patterned to make isolated patterns of the bottom conductive layer 2012.

Figure 21A:
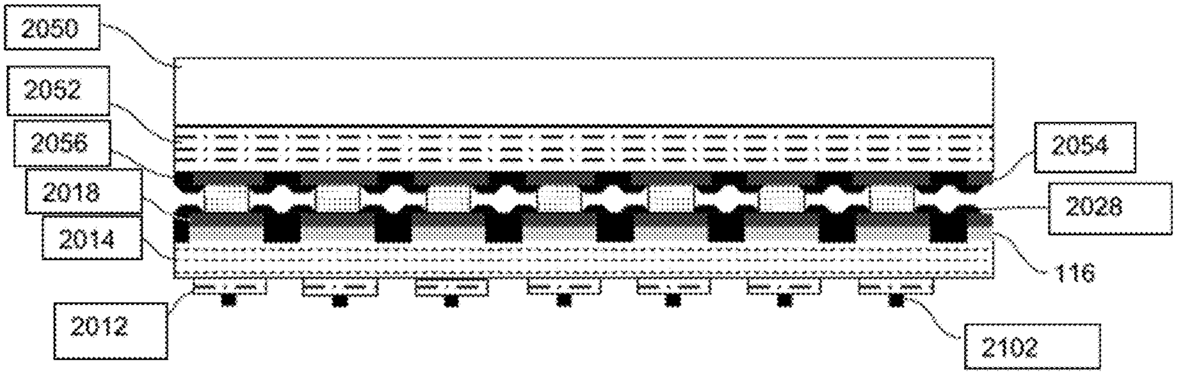
FIG. 21A shows a cross-sectional view of the integrated structure with patterned bottom electrode having ohmic contacts, in accordance with an embodiment of the present invention.

FIG. 21A shows a cross-sectional view of the integrated structure with patterned bottom conductive layer having ohmic contacts, in accordance with an embodiment of the present invention. To get connection to those layers, ohmic contacts and/or a common electrode (or patterned electrode) can be used.

In this case, a specific ohmic contact 2102 is needed to get proper connection to the patterned bottom conductive layer 2012. In one embodiment, the ohmic contact can be similar as the common conductive layer. In one case, the ohmic contact is a transparent material. In another case, if the ohmic contact is opaque, the ohmic contact is patterned to provide path for the light out. The pattern can be either inside the isolated patterned conductive layer 2012 or at the edge of the isolated patterned conductive layer 2012. The isolated patterned conductive layer 2012 also can have a 3D shape, such as that of a lens (part of a sphere), to control the direction of the light output.

Figures 1, 21B:
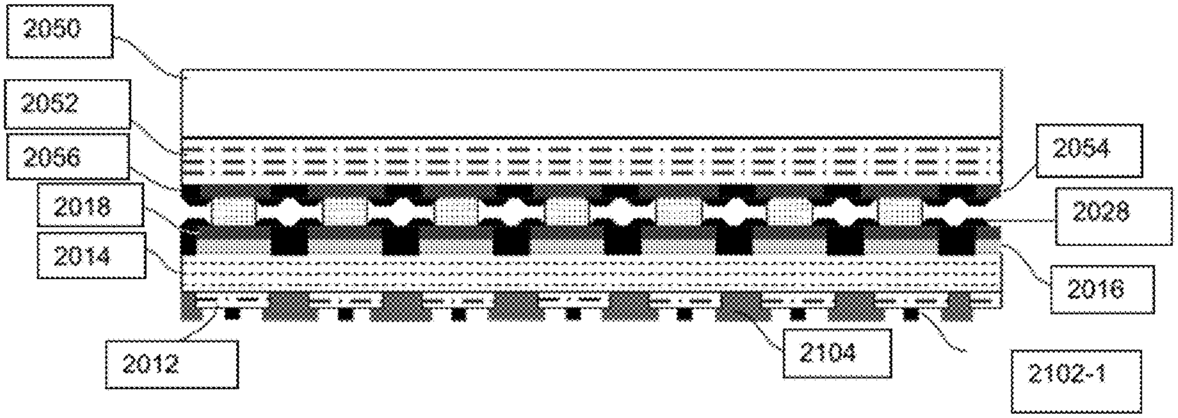
Figures 2, 21B:
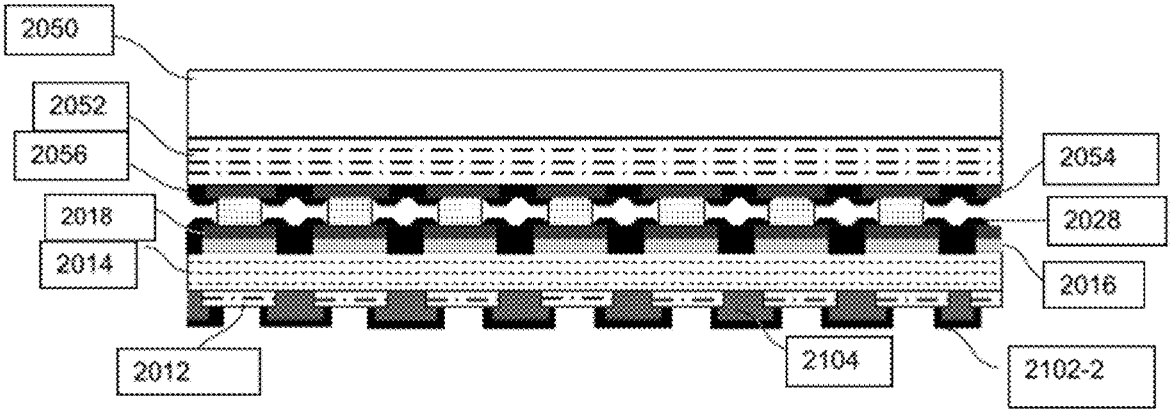

FIG. 21B shows a cross-sectional view of the integrated structure having ohmic contacts and a dielectric layer between patterned bottom electrode, in accordance with an embodiment of the present invention.

FIG. 21B-1 shows a case where the ohmic contact 2102-1 is inside the isolated patterned bottom conductive layer 2012. A dielectric layer 2104 may be deposited and patterned around the isolated patterned bottom conductive layer 2012. The dielectric layer may also be deposited before depositing the ohmic contacts 2102.

Figure 2:
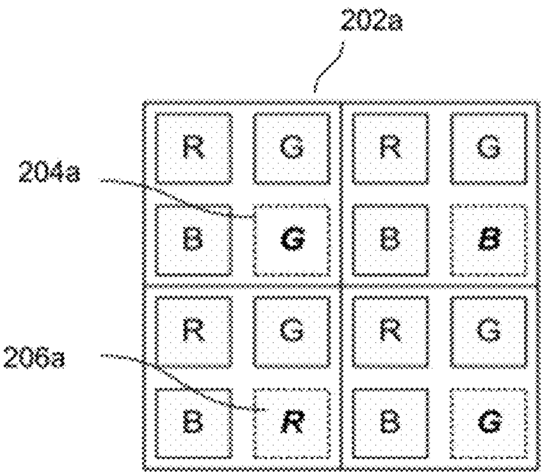
Figure 2:
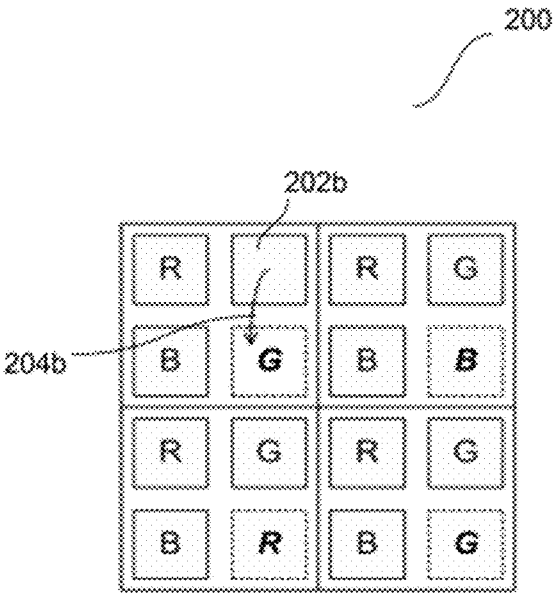

FIG. 21B-2 shows a case where the ohmic contact 2102-2 is at the edge of the isolated patterned bottom conductive layer 2012. In case of the outer ohmic contact layer, the same layer can be used as common electrode. In another case, another layer can be deposited on the top layer.

Figure 21C:
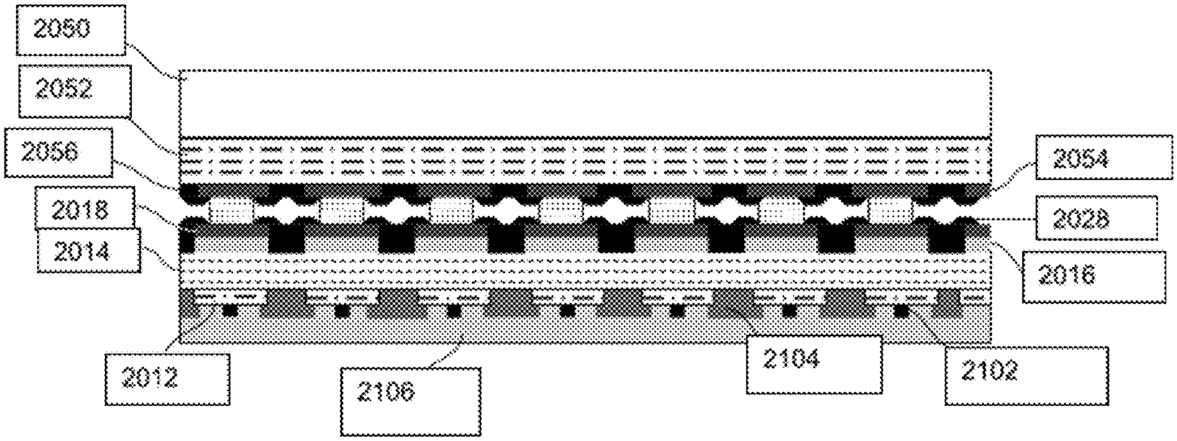
FIG. 21C shows a cross-sectional view of the integrated structure covering patterned bottom electrode with a common electrode, in accordance with an embodiment of the present invention.

FIG. 21C shows a cross-sectional view of the integrated structure covering patterned bottom electrode with another electrode, in accordance with an embodiment of the present invention. A common electrode 2106 may be deposited over the patterned bottom conductive layer 2012 having ohmic contacts 2102 and dielectric layer 2104 in between them.

According to one embodiment, a method of manufacturing a pixelated structure may be provided. The method may comprise providing a donor substrate comprising the plurality of pixelated micro devices, bonding a selective set of the pixelated micro devices from the donor substrate to a system substrate; and patterning a bottom conductive layer of the pixelated micro devices after separating the donor substrate from the system substrate.

According to other embodiment, patterning the bottom conductive layer may comprises at least one of: thinning the bottom conductive layer or making isolated patterns of the bottom conductive layer, providing ohmic contact to the isolated patterns of the bottom conductive layer. The ohmic contact is one of: a transparent material or opaque. The ohmic contact is patterned in case the ohmic contact is opaque.

According to some other embodiments, providing ohmic contact to the isolated patterns of the bottom conductive layer comprises providing the ohmic contact inside the isolated patterns of the bottom conductive layer or/and providing the ohmic contact at the edge of the isolated patterns of the bottom conductive layer.

According to yet other embodiments, the method may further comprise providing a patterned dielectric layer between the isolated patterns of the bottom conductive layer and providing a common electrode over the patterned bottom conductive layer.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

The invention claimed is:

1. A method of integration for pixels that limits a quantity of microdevices, the method comprising:

integrating a pixel cluster on a substrate, wherein the pixel cluster comprises a pixel set and a spare pixel set, the pixel set comprising RGB subpixels and at least one spare subpixel;

inducing a spatial-coordinate variation among the pixel set of the pixel cluster to permit use of the spare pixel set while maintaining an acceptable non-uniformity; and detecting a defected subpixel after an integration process; and compensating for the defected subpixel by using the spare subpixel, wherein compensating includes at least one of:

transferring a luminance contribution of the defected subpixel to a neighboring spare subpixel;

replacing or functionally compensating for the defected subpixel using the spare subpixel positioned with the spatial-coordinate variation; or correcting a non-uniformity caused by the defected subpixel or replacement by blocking a portion of at least one signal emitted by a subpixel in proportion to the non-uniformity.

2. The method of claim 1 wherein each subpixel comprises four microdevices with three functional microdevices and a defected microdevice, increasing a brightness of the functional microdevices by ½ to compensate for a brightness loss caused by the defected microdevice.

3. The method of claim 1, wherein compensating for the defected subpixel using the spare subpixel includes positioning the spare subpixel with the spatial-coordinate variation relative to the defective subpixel, the method further comprising:

determining a spatial-coordinate difference between the defected subpixel and the spare subpixel;

extracting a maximum distance and a minimum distance between the spare subpixel and the defected subpixel; and extracting the spatial-coordinate variation in coordinates to minimize an effect of a location of the spare subpixel.

4. The method of claim 3, wherein the spatial-coordinate variation of a position of the microdevices is periodic.

5. The method of claim 3, wherein the spatial-coordinate variation added to the microdevices in a display system is random.

6. The method of claim 4, wherein the microdevices comprise RGB microdevices and the spatial-coordinate variation is applied to the RGB microdevices in a same order, wherein each of the microdevices has a different spatial variation.

7. The method of claim 3 further comprising: fabricating the microdevices with an induced spatial variation to create the spatial-coordinate variation; and transferring the microdevices to a two-dimensional landing-area array in a system substrate.

8. The method of claim 7, wherein the microdevices are in a two-dimensional array structure that has a smaller pitch than a pitch of the two-dimensional landing-area array in the system substrate.

9. The method of claim 8, further comprising transferring the microdevices to a different pitch than the smaller pitch of the two-dimensional array structure.

10. The method of claim 9, wherein the two-dimensional landing-area array accommodates the different pitch of the microdevices, wherein the two-dimensional landing-area array is large or has a similar pitch variation to the spatial-coordinate variation.

11. The method of claim 7, further comprising limiting the induced spatial variation to an extent of an allowable non-uniformity in the at least one signal of the microdevices.

12. The method of claim 11, further comprising calculating the allowable non-uniformity by: calculating a global non-uniformity based on an average of the at least one signal of the microdevice in areas that include more than one microdevices; or calculating a local non-uniformity calculated based on the spatial-coordinate variation in perceived signals of a plurality of adjacent microdevices.

13. The method of claim 11, further comprising calibrating for the induced spatial variation by modifying the at least one signal of the microdevices based on a position of the microdevices to eliminate an unwanted non-uniformity induced by the induced spatial variation of the microdevices.

14. The method of claim 1, wherein compensating for the defected subpixel using the spare subpixel, further comprises:

determining a maximum allowable spatial-coordinate variation based on an acceptable spatial non-uniformity in the at least one signal of a plurality of microdevices;

determining a number of spare microdevices based on a defect rate in the microdevices and an allowable spatial non-uniformity;

transferring, the microdevices into a system substrate based on the maximum allowable spatial variation and distributing the spare microdevices between the microdevices in the system substrate based on the maximum allowable spatial variation and the defect rate;

replacing defective microdevices with the spare microdevices;

calibrating the system substrate based on an induced variation and the spare microdevices; and correcting the at least one signal of the microdevices with calibration data.

15. The method of claim 1, wherein compensating for the defected subpixel using the spare subpixel further comprises correcting a nonuniformity caused by the defected subpixel or by the use of the spare subpixel, the correcting comprising:

correcting at least a portion of the nonuniformity, the non-uniformity from at least one of: a spatial variation, a device process, a system substrate; or the integration process of the microdevices into the system substrate; and blocking part of the at least one signal created or absorbed by the microdevice wherein a blocked area that blocks the at least one signal is proportional to a signal of the microdevice.

16. The method of claim 15, wherein when the portion of the non-uniformities are from the device process; and evaluating a microdevice performance by measuring a measured non-uniformity of the microdevice.

17. The method of claim 16, further comprising, during the device process, using an opaque material as the blocked area to block the signal; or modifying the blocked area of the microdevice to correct for the measured non-uniformity in the microdevice performance.

18. The method of claim 17, further comprising:

measuring the microdevice performance before the transferring of the microdevice;

transferring the microdevice into the system substrate;

creating the blocked area after transferring the microdevice into the system substrate;

measuring the microdevice performance after the transfer; and creating at least one opaque layer from the opaque material that block the signals or tuning the blocked area of the microdevice to correct for the measured non-uniformity in the microdevice performance.

19. The method of claim 18, wherein the microdevice includes at least one optoelectronic device, the method further comprising depositing and patterning the at least one opaque layer on top of the at least one optoelectronic device, wherein an area of the at least one opaque layer is proportional to the non-uniformities.

20. The method of claim 19, wherein either a contact layer of the optoelectronic device or an electrode of an array includes the at least one opaque layer, and a size of the at least one optoelectronic device is modified according to the non-uniformities.

* * * * *